(12) United States Patent
Pflumm et al.

(10) Patent No.: US 9,385,335 B2
(45) Date of Patent: Jul. 5, 2016

(54) ORGANIC ELECTROLUMINESCENT DEVICE

(75) Inventors: Christof Pflumm, Frankfurt am Main (DE); Niels Schulte, Kelkheim (DE)

(73) Assignee: Merck Patent GmbH (DE)

( * ) Notice: Subject to any disclaimer, the term of this patent is extended or adjusted under 35 U.S.C. 154(b) by 0 days.

(21) Appl. No.: 14/009,810

(22) PCT Filed: Mar. 7, 2012

(86) PCT No.: PCT/EP2012/001016
§ 371 (c)(1),
(2), (4) Date: Oct. 4, 2013

(87) PCT Pub. No.: WO2012/136295
PCT Pub. Date: Oct. 11, 2012

(65) Prior Publication Data
US 2014/0014940 A1    Jan. 16, 2014

(30) Foreign Application Priority Data

Apr. 5, 2011   (EP) .................................... 11002816

(51) Int. Cl.
| | | |
|---|---|---|
| H01L 21/00 | (2006.01) | |
| H01L 51/50 | (2006.01) | |
| C09B 57/00 | (2006.01) | |
| H01L 51/00 | (2006.01) | |

(52) U.S. Cl.
CPC ............ *H01L 51/5004* (2013.01); *C09B 57/00* (2013.01); *C09B 57/008* (2013.01); *H01L 51/5016* (2013.01); *H01L 51/5096* (2013.01); *H01L 51/0059* (2013.01); *H01L 51/0061* (2013.01); *H01L 51/0067* (2013.01); *H01L 51/0072* (2013.01); *H01L 51/0074* (2013.01); *H01L 51/0077* (2013.01); *H01L 51/0085* (2013.01); *H01L 51/0087* (2013.01); *H01L 51/0094* (2013.01)

(58) Field of Classification Search
CPC ..................... H01L 51/0085; H01L 51/5004
USPC ............................................ 257/40
See application file for complete search history.

(56) References Cited

U.S. PATENT DOCUMENTS

| | | | |
|---|---|---|---|
| 7,022,421 B2 | 4/2006 | Thompson et al. | |
| 7,576,208 B2 * | 8/2009 | Brown et al. | .................. 546/49 |
| 9,118,020 B2 | 8/2015 | Kondakova et al. | |
| 2003/0230980 A1 | 12/2003 | Forrest et al. | |
| 2007/0252516 A1 | 11/2007 | Kondakova et al. | |
| 2009/0191427 A1 | 7/2009 | Liao et al. | |
| 2011/0101328 A1 | 5/2011 | Kaiser et al. | |
| 2011/0108818 A1 | 5/2011 | Kaiser et al. | |
| 2012/0056169 A1 | 3/2012 | Kaiser et al. | |

FOREIGN PATENT DOCUMENTS

| | | |
|---|---|---|
| DE | 102008063490 A1 | 6/2010 |
| JP | 2005-502165 A | 1/2005 |
| JP | 2005-530320 A | 10/2005 |
| JP | 2009-147276 A | 7/2009 |
| JP | 2009-535812 A | 10/2009 |
| WO | WO-2010069442 A1 | 6/2010 |
| WO | WO-2010108579 A1 | 9/2010 |
| WO | WO 2012136295 A1 * | 10/2012 |

OTHER PUBLICATIONS

International Preliminary Report on Patentability, for PCT/EP2012/001016, date of issuance Oct. 8, 2013.
International Search Report for PCT/EP2012/001016 mailed May 30, 2012.
Machine translation for JP 2009-147276 A from Japan Platform for Patent Information.

* cited by examiner

*Primary Examiner* — Ajay K Arora
(74) *Attorney, Agent, or Firm* — Drinker Biddle & Reath LLP

(57) ABSTRACT

The present invention relates to phosphorescent organic electroluminescent devices which have a low concentration of the phosphorescent emitter in the emitting layer.

16 Claims, No Drawings

ORGANIC ELECTROLUMINESCENT DEVICE

CROSS-REFERENCE TO RELATED APPLICATIONS

This application is a national stage application (under 35 U.S.C. §371) of PCT/EP2012/001016, filed Mar. 7, 2012, which claims benefit of European application 11002816.4, filed Apr. 5, 2011.

The present invention relates to phosphorescent organic electroluminescent devices which have a low concentration of the phosphorescent emitter in the emitting layer.

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. The emitting materials employed here are increasingly organometallic complexes which exhibit phosphorescence instead of fluorescence (M. A. Baldo et al., *Appl. Phys. Lett.* 1999, 75, 4-6). For quantum-mechanical reasons, an up to four-fold energy and power efficiency is possible using organometallic compounds as phosphorescence emitters. In general, however, there is still a need for improvement in the case of OLEDs, in particular also in the case of OLEDs which exhibit triplet emission (phosphorescence).

In the case of OLEDs in accordance with the prior art, the phosphorescent emitters are usually employed in a concentration of 10% by vol. or more. A problem on use of phosphorescent emitters, in particular iridium or platinum complexes, in mass production, besides the rarity of these elements, is the not always adequate thermal stability. In order to achieve high cycle times, high vapour-deposition rates would be desirable. However, this is only possible to a limited extent due to the associated higher vapour-deposition temperature and thermal decomposition of the complexes caused by this. One possibility would be to reduce the emitter concentration, enabling longer cycle times to be achieved in spite of thermal instability since lower vapour-deposition rates would be adequate. However, the efficiency and lifetime in emission layers in accordance with the prior art drop considerably if the emitter concentration is significantly below 10% by vol. This applies, in particular, in the case of green- or blue-phosphorescent emitters, whereas red-emitting OLEDs in which an emitter concentration of less than 10% by vol. is present and which exhibit good properties are already known.

In particular, the so-called "roll-off" behaviour also becomes greater with decreasing emitter concentration. This is taken to mean that the efficiency of an organic electroluminescent device is usually significantly lower in the case of a high luminous density than in the case of a low luminous density. High efficiency is thus obtained in the case of low luminous densities, whereas only low efficiency is obtained in the case of high luminous densities. By contrast, higher quantum efficiency in the case of a high luminous density would result in higher power efficiency and thus in lower energy consumption of the OLED.

In OLEDs in accordance with the prior art, a comparatively high dependence of the properties of the electroluminescent device on the emitter concentration is furthermore also observed. This results in a small process window in mass production, i.e. major deviations in the properties of the electroluminescent device are observed even in the case of minor variations in the vapour-deposition rates and thus in the emitter concentration. It would therefore be desirable, for process security, to achieve a greater tolerance to variations in the vapour-deposition rate.

In OLEDs in accordance with the prior art, it is furthermore observed that the properties of the OLED are essentially dependent on the position of the HOMO or LUMO of the phosphorescent emitter, especially on the position of the HOMO of the emitter. In particular in the case of phosphorescent platinum complexes, this can result in problems with hole injection and thus in reduced efficiency and/or lifetime with these complexes. Further improvements are desirable here.

The technical problem on which the present invention is based is therefore the provision of a phosphorescent organic electroluminescent device which, in spite of the use of a low emitter concentration of less than 10%, exhibits good roll-off behaviour, low dependence of the emission properties on the emitter concentration and/or low dependence of the emission properties on the position of the HOMO or LUMO of the emitter and in which, in addition, the efficiency and lifetime are not or at least not significantly impaired compared with an OLED which comprises the phosphorescent emitter in a concentration of 10% by vol. or more.

Surprisingly, it has been found that this problem is solved by an organic electroluminescent device as described below. In particular, it has been observed that the properties are essentially dependent on the difference of the HOMO of the electron-blocking layer and of the emitting layer and on the difference of the LUMO of the hole-blocking layer and of the emitting layer.

The invention thus relates to an organic electroluminescent device having an emission maximum of 570 nm comprising, in this sequence, an anode, an electron-blocking layer (EBL), a phosphorescent emission layer (EML) which comprises at least one phosphorescent compound and at least one matrix material, where the total concentration of all phosphorescent compounds is <10% by vol., a hole-blocking layer (HBL) and a cathode, where the electroluminescent device comprises no aluminium metal complex between the emitting layer and the cathode, characterised in that the following applies to the layers:

a) HOMO(EBL)−HOMO(EML)≤0.4 eV;
b) LUMO(EML)−LUMO(HBL)≤0.4 eV;
c) HOMO of all matrix materials of the EML≥−6.0 eV; and
d) LUMO(EML)≤−2.5 eV.

An electron-blocking layer in the sense of the present invention is a layer which is directly adjacent to the emitting layer on the anode side. The electron-blocking layer here may also simultaneously be the hole-transport layer or the exciton-blocking layer. HOMO(EBL) is the HOMO of the material of the electron-blocking layer. If this layer consists of a plurality of materials, HOMO(EBL) is the highest HOMO of these materials. LUMO(EBL) is the LUMO of the material of the electron-blocking layer. If this layer consists of a plurality of materials, LUMO(EBL) is the lowest LUMO of these materials.

A phosphorescent emission layer in the sense of the invention is a layer which comprises a phosphorescent compound. HOMO(EML) is the HOMO of the matrix materials of the emission layer. In the case of a single matrix, HOMO(EML) is the HOMO of this matrix material. On use of a plurality of matrix materials ("mixed matrix"), HOMO(EML) is the highest HOMO of the matrix components. LUMO(EML) is the LUMO of the matrix materials of the emission layer. In the case of a single matrix, LUMO(EML) is the LUMO of this matrix material. On use of a plurality of matrix materials ("mixed matrix"), LUMO(EML) is the lowest LUMO of the matrix components.

A phosphorescent compound in the sense of this invention is a compound which exhibits luminescence from an excited state having relatively high spin multiplicity, in particular from an excited triplet state, at room temperature. For the purposes of this invention, all luminescent transition-metal complexes and all luminescent lanthanide complexes, in particular all luminescent iridium, platinum and copper compounds, are to be regarded as phosphorescent compounds.

A matrix material in the sense of the present invention is any material which is present in the emitting layer and is not a phosphorescent compound.

A hole-blocking layer in the sense of the present invention is a layer which is directly adjacent to the emitting layer on the cathode side. The hole-blocking layer here may also simultaneously be the electron-transport layer. LUMO(HBL) is the LUMO of the material of the hole-blocking layer. If this layer consists of a plurality of materials, LUMO(HBL) is the lowest LUMO of these materials. HOMO(HBL) is the HOMO of the material of the hole-blocking layer. If this layer consists of a plurality of materials, HOMO(HBL) is the highest HOMO of these materials.

The HOMO (highest occupied molecular orbital), the LUMO (lowest occupied molecular orbital) and the triplet level $T_1$ are determined by quantum-chemical calculations, as explained in general below in the example part.

For clarification, it is again emphasised here that the values for HOMO and LUMO are by definition negative numerical values. The highest HOMO is therefore the HOMO with the smallest modulus, and the lowest LUMO is the LUMO with the largest modulus.

The emission maximum in the sense of the present invention is taken to mean the maximum of the electroluminescence spectrum of the organic electroluminescent device. The person skilled in the art of organic electroluminescence knows which emitter has which emission maximum, and he will therefore be able to select suitable emitters which have an emission maximum of ≤570 nm.

The organic electroluminescent device need not necessarily comprise only layers which are built up from organic or organometallic materials. Thus, it is also possible for anode, cathode and/or one or more layers to comprise inorganic materials or to be built up entirely from inorganic materials.

In a preferred embodiment of the invention, the emission maximum of the organic electroluminescent device is ≤560 nm, particularly preferably ≤550 nm, very particularly preferably ≤540 nm.

In general, it is desirable, for economic reasons and owing to the rarity of the metals iridium and platinum, to select the proportion of the phosphorescent compound in the emission layer as small as possible, so long as this is not accompanied by a significant impairment of the properties of the organic electroluminescent device. In a further preferred embodiment of the invention, the total concentration of all phosphorescent compounds in the emitting layer is therefore ≤9% by vol., particularly preferably ≤8% by vol., very particularly ≤7% by vol.

The total concentration of all phosphorescent compounds in the emitting layer is furthermore preferably ≥1% by vol., particularly preferably ≥2% by vol., very particularly preferably ≥3% by vol. This preference is due to the fact that the efficiency, the lifetime and/or the roll-off behaviour are usually impaired at a concentration of the phosphorescent compound of less than 1% by vol.

In a further preferred embodiment of the invention, HOMO (EBL)−HOMO(EML) is ≤0.35 eV, particularly preferably ≤0.3 eV, very particularly preferably ≤0.25 eV.

In still a further preferred embodiment of the invention, LUMO(EML)−LUMO(HBL) is ≤0.35 eV, particularly preferably ≤0.3 eV, very particularly preferably ≤0.25 eV.

In still a further preferred embodiment of the invention, HOMO(EML), i.e. the HOMO of all matrix components in the emission layer, is ≥−5.8 eV, particularly preferably ≥−5.7 eV, very particularly preferably ≥−5.6 eV, in particular ≥−5.55 eV.

In still a further preferred embodiment of the invention, LUMO(EML), i.e. the LUMO of all matrix components in the emission layer, is ≤−2.55 eV, particularly preferably ≤−2.6 eV.

For the emitter, the following relationships preferably apply relative to the matrix material or the matrix materials:
HOMO(emitter)−HOMO(EML)≤0.3 eV and/or
LUMO(EML)−LUMO(emitter)≤0.3 eV.
HOMO(emitter) and LUMO(emitter) here are in each case the HOMO and LUMO respectively of the phosphorescent emitter.

In a further preferred embodiment of the invention, no metal complex is present between the emission layer and the cathode. This preference is due to the frequently low thermal stability and high sensitivity to hydrolysis of the metal complexes, which are usually used as electron-transport material or hole-blocking material. Furthermore, hydroxyquinoline, as is used as ligand, for example in $Alq_3$, is mutagenic, and it is therefore desirable to avoid complexes of this type.

The above-mentioned preferred embodiments can be combined with one another as desired. The above-mentioned preferred embodiments particularly preferably occur simultaneously.

Preference is thus given to an organic electroluminescent device having an emission maximum of ≤560 nm which comprises a total concentration of all phosphorescent compounds of between 1 and 9% by vol. in the emission layer and which comprises no metal complex between the emission layer and the cathode, characterised in that the following applies to the layers:
a) HOMO(EBL)−HOMO(EML)≤0.35 eV;
b) LUMO(EML)−LUMO(HBL)≤0.35 eV;
c) HOMO of all matrix materials of the EML≥−5.9 eV; and
d) LUMO(EML)≤−2.55 eV.

Particular preference is given to an organic electroluminescent device having an emission maximum of 550 nm which comprises a total concentration of all phosphorescent compounds of between 2 and 8% by vol. in the emission layer and which comprises no metal complex between the emission layer and the cathode, characterised in that the following applies to the layers:
a) HOMO(EBL)−HOMO(EML)≤0.3 eV;
b) LUMO(EML)−LUMO(HBL)≤0.3 eV;
c) HOMO of all matrix materials of the EML≥−5.8 eV; and
d) LUMO(EML)≤−2.6 eV.

Very particular preference is thus given to an organic electroluminescent device having an emission maximum of 540 nm which comprises a total concentration of all phosphorescent compounds of between 3 and 7% by vol. in the emission layer and which comprises no metal complex between the emission layer and the cathode, characterised in that the following applies to the layers:
a) HOMO(EBL)−HOMO(EML)≤0.25 eV;
b) LUMO(EML)−LUMO(HBL)≤0.25 eV;
c) HOMO of all matrix materials of the EML≥−5.8 eV; and
d) LUMO(EML)≤−2.6 eV.

Furthermore, the following conditions preferably apply in the organic electroluminescent device according to the invention:

In a preferred embodiment of the invention, the HOMO (EBL) is ≥−5.5 eV, particularly preferably ≥−5.45 eV, very particularly preferably ≥−5.4 eV, in particular ≥−5.35 eV. In particular, the HOMO for all materials of the EBL is preferably ≥−5.5 eV, particularly preferably ≥−5.45 eV, very particularly preferably ≥−5.4 eV, in particular ≥−5.35 eV.

In a further preferred embodiment of the invention, the LUMO(HBL) is ≤−2.5 eV. The LUMO for all materials of the HBL is particularly preferably ≤−2.5 eV.

In a further preferred embodiment of the invention, the triplet level $T_1$(emitter)−$T_1$(matrix) is ≤0.2 eV, particularly preferably ≤0.15 eV, very particularly preferably ≤0.1 eV. $T_1$(matrix) here is the triplet level of the matrix material in the emission layer, and $T_1$(emitter) is the triplet level of the phosphorescent emitter. If the emission layer comprises a plurality of matrix materials, the above-mentioned relationship preferably applies to each of the matrix materials.

In a further preferred embodiment of the invention, the triplet level $T_1$(emitter)−$T_1$(EBL) is ≤0.3 eV, particularly preferably ≤0.25 eV, very particularly preferably ≤0.2 eV. $T_1$(EBL) here is the triplet level of the material of the electron-blocking layer. If the electron-blocking layer consists of a plurality of materials, this condition preferably applies to all materials of the electron-blocking layer.

In a further preferred embodiment of the invention, the triplet level $T_1$(emitter)−$T_1$(HBL) is ≤0.3 eV, particularly preferably ≤0.25 eV, very particularly preferably ≤0.2 eV. $T_1$(HBL) here is the triplet level of the material of the hole-blocking layer. If the hole-blocking layer consists of a plurality of materials, this condition preferably applies to all materials of the hole-blocking layer.

In a further preferred embodiment of the invention, the emission layer comprises precisely one phosphorescent compound, in particular a phosphorescent metal complex. Suitable phosphorescent metal complexes are indicated in greater detail below.

In a preferred embodiment of the invention, the emission layer comprises precisely one matrix material, to which the above-mentioned conditions for HOMO and LUMO apply.

In a further preferred embodiment of the invention, the emission layer comprises two or more different matrix materials ("mixed matrix"), particularly preferably two or three matrix materials.

If two or more matrix materials are used, the concentration of the component having the highest HOMO is preferably ≤50% by vol., particularly preferably ≤45% by vol., very particularly preferably ≤40% by vol., in particular ≤35% by vol.

If two or more matrix materials are used, the concentration of the component having the highest HOMO is furthermore preferably ≥4% by vol., particularly preferably ≥6% by vol., very particularly preferably ≥8% by vol., in particular ≥10% by vol.

In a further preferred embodiment of the invention, the matrix material having the highest HOMO is not present in the electron-blocking layer.

In order that the electron-blocking layer blocks electrons efficiently, the following preferably applies: LUMO(EBL)−LUMO(EML)≥0.2 eV, particularly preferably ≥0.25 eV, very particularly preferably ≥0.3 eV, in particular ≥0.35 eV.

In order that the hole-blocking layer blocks holes efficiently, the following is preferred: HOMO(EML)−HOMO(HBL)≥0.2 eV, particularly preferably ≥0.25 eV, very particularly preferably ≥0.3 eV, in particular ≥0.35 eV.

The organic electroluminescent device according to the invention may, in addition to the electron-blocking layer, the emission layer and the hole-blocking layer, also comprise further layers, for example hole-injection and/or -transport layers, electron-injection and/or -transport layers, charge-generation layers or other interlayers.

In a preferred embodiment of the invention, the organic electroluminescent device according to the invention comprises precisely one emission layer.

In a preferred embodiment of the invention, the organic electroluminescent device comprises at least one hole-transport layer (HTL) between the anode and the electron-blocking layer, where the following is preferred: HOMO(HTL)−HOMO(EBL)≤0.4 eV, particularly preferably ≤0.35 eV, very particularly preferably ≤0.3 eV, in particular ≤0.25 eV. HOMO(HTL) here is the HOMO of the hole-transport layer. If this layer consists of a plurality of materials, HOMO(HTL) is the highest HOMO of these materials.

In a further preferred embodiment of the invention, the organic electroluminescent device comprises at least one electron-transport layer (ETL) between the cathode and the hole-blocking layer. For the electron-transport layer, LUMO(ETL)≤−2.5 eV preferably applies to the LUMO of the layer. LUMO(ETL) here is the LUMO of the electron-transport layer. If this layer consists of a plurality of materials, LUMO(ETL) is the LUMO of these materials with the largest modulus, i.e. the lowest LUMO.

In a particularly preferred embodiment of the invention, the organic electroluminescent device according to the invention comprises both at least one hole-transport layer and also at least one electron-transport layer.

The precise structure of the materials which are used in the electron-blocking layer, in the emission layer, in the hole-blocking layer and in further layers which may be present are of secondary importance, so long as the materials satisfy the above-mentioned conditions with respect to the physical parameters. In general, it is possible to use all materials as are usually used in these layers, provided that the materials are matched to one another in such a way that the above-mentioned physical parameters are satisfied. The person skilled in the art will be able to determine the corresponding physical parameters without problems and select suitable material combinations.

If two or more matrix materials are used, the component of the matrix material having the highest HOMO is preferably selected from the group consisting of triarylamine derivatives, carbazole derivatives, condensed carbazole derivatives and diaza- and tetraazasilole derivatives. A triarylamine derivative in the sense of this application is taken to mean a compound in which three aromatic or heteroaromatic groups are bonded to a nitrogen. It is also possible here for the compound to contain more than one amino group or for the aromatic groups to be connected to one another, for example by carbon bridges or direct bonds. A carbazole derivative in the sense of this application is taken to mean a carbazole or an azacarbazole which preferably contains an aromatic or heteroaromatic group bonded to the nitrogen and which may also be substituted. A condensed carbazole derivative in the sense of this invention is taken to mean a carbazole or azacarbazole onto which at least one further aromatic and/or non-aromatic ring is condensed. Thus, for example, an indolocarbazole or indenocarbazole is formed. Furthermore, it is possible for an aromatic or heteroaromatic substituent on the nitrogen of the carbazole to be connected to the carbazole skeleton by a single bond or a bridge, for example a carbon bridge.

Preferred triarylamine derivatives are the compounds of the following formulae (1) to (7),

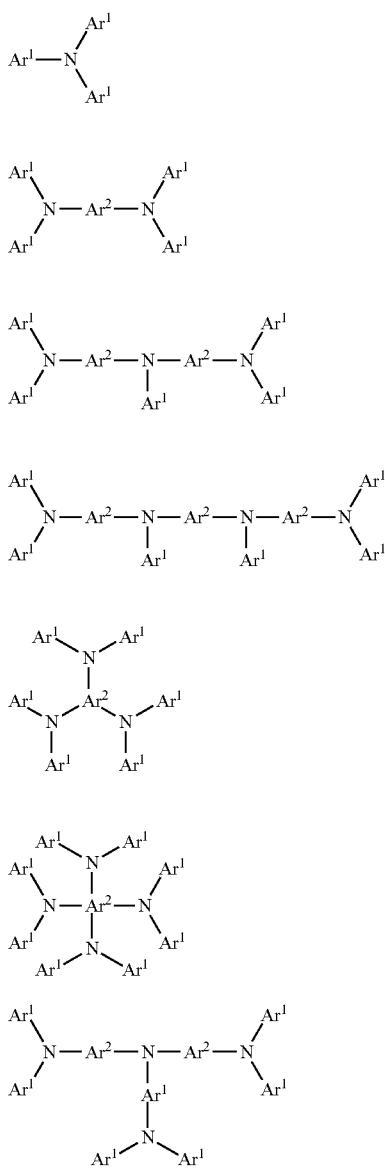

formula (1)
formula (2)
formula (3)
formula (4)
formula (5)
formula (6)
formula (7)

where the following applies to the symbols used:

Ar¹ is on each occurrence, identically or differently, a monovalent aromatic or heteroaromatic ring system having 5 to 60 aromatic ring atoms, which may be substituted by one or more radicals R¹; two groups Ar¹ here which are bonded to the same nitrogen atom, and/or a group Ar² and a group Ar¹ which are bonded to the same nitrogen atom may be linked to one another by a single bond or a bridge selected from the group consisting of $B(R^1)$, $C(R^1)_2$, $Si(R^1)_2$, $C=O$, $C=NR^1$, $C=C(R^1)_2$, O, S, S=O, $SO_2$, $N(R^1)$, $P(R^1)$ and $P(=O)R^1$;

Ar² is on each occurrence, identically or differently, a divalent, trivalent or tetravalent aromatic or heteroaromatic ring system having 5 to 60 aromatic ring atoms, which may be substituted by one or more radicals R¹;

R¹ is on each occurrence, identically or differently, H, D, F, Cl, Br, I, CHO, $C(=O)Ar^3$, $P(=O)(Ar^3)_2$, $S(=O)Ar^3$, $S(=O)_2Ar^3$, $CR^2=CR^2Ar^3$, CN, $NO_2$, $Si(R^2)_3$, $B(OR^2)_2$, $B(R^2)_2$, $B(N(R^2)_2)_2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals R², where one or more non-adjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms may be replaced by D, F, Cl, Br, I, CN or $NO_2$, or an aromatic or heteroaromatic ring system having 5 to 60 aromatic ring atoms, which may in each case be substituted by one or more radicals R², or an aryloxy or heteroaryloxy group having 5 to 60 aromatic ring atoms, which may be substituted by one or more radicals R², or a combination of these systems; two or more adjacent substituents R¹ here may also form a mono- or polycyclic, aliphatic or aromatic ring system with one another;

Ar³ is on each occurrence, identically or differently, an aromatic or heteroaromatic ring system having 5 to 40 aromatic ring atoms, which may be substituted by one or more radicals R²;

R² is on each occurrence, identically or differently, H, D or an aliphatic, aromatic and/or heteroaromatic hydrocarbon radical having 1 to 20 C atoms, in which, in addition, H atoms may be replaced by D or F; two or more adjacent substituents R² here may also form a mono- or polycyclic, aliphatic or aromatic ring system with one another.

If two groups Ar¹ or one group Ar² and one group Ar¹, which are in each case bonded to the same nitrogen atom, are linked to one another by a single bond, a carbazole derivative thereby forms.

Ar² here is a divalent group in the compounds of the formulae (2), (3), (4) and (7) and a trivalent group in the compounds of the formula (5) and a tetravalent group in the compounds of the formula (6).

Preferred carbazole derivatives are the compounds of the following formulae (8) to (11),

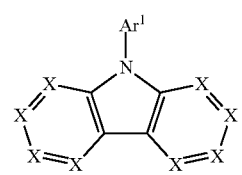

formula (8)

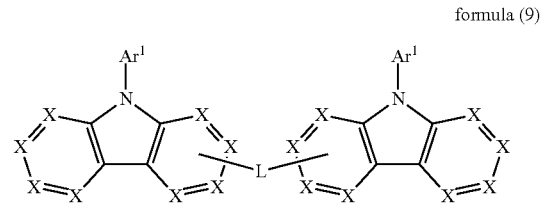

formula (9)

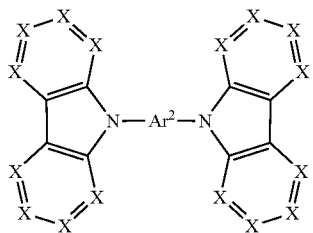

formula (10)

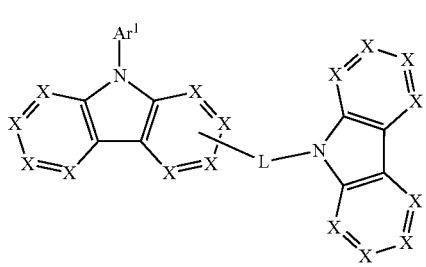

formula (11)

where Ar¹, Ar² and R¹ have the meanings mentioned above, and furthermore:

L is a single bond or a divalent group selected from an alkylene group having 1 to 10 C atoms or an alkenylene or alkynylene group having 2 to 10 C atoms, each of which may be substituted by one or more radicals R¹, an aromatic or heteroaromatic ring system having 5 to 30 aromatic ring atoms, which may in each case be substituted by one or more radicals R¹, C=O, O, S or NR¹ or a combination of 2, 3, 4 or 5 of these groups;

X is on each occurrence, identically or differently, $CR^1$ or N, with the proviso that a maximum of two symbols X per ring stand for N and that X stands for C if a group L is bonded to this group X;

two adjacent groups X here may also be replaced by a group of the following formula (12):

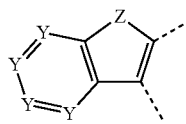

formula (12)

the dashed bonds here indicate the linking of this unit to the carbazole derivative, i.e. the two carbon atoms which are linked to the dashed bonds in formula (12) correspond to the two adjacent groups X of the carbazole; furthermore:

Y is on each occurrence, identically or differently, $CR^1$ or N, with the proviso that a maximum of two symbols Y per ring stand for N;

Z is selected on each occurrence, identically or differently, from the group consisting of $C(R^1)_2$, $N(R^1)$, $N(Ar^1)$, O, S, $B(R^1)$, $Si(R^1)_2$, C=O, C=NR¹, $C=C(R^1)_2$, S=O, $SO_2$, $CR^1$—$CR^1$, $P(R^1)$ and P(=O)R¹.

The linking of the two carbazole groups in formula (9) preferably takes place via the 2,2'-, the 3,3' or the 2,3'-positions, and the linking of the carbazole group in formula (11) preferably takes place via the 2- or 3-position.

Materials which are furthermore preferred are compounds which contain both at least one arylamino group and also at least one carbazole group or at least one carbazole derivative. These are preferably compounds of the following formulae (13), (14) and (15),

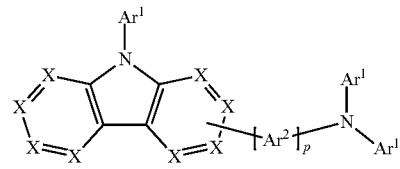

formula (13)

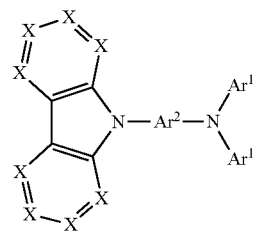

formula (14)

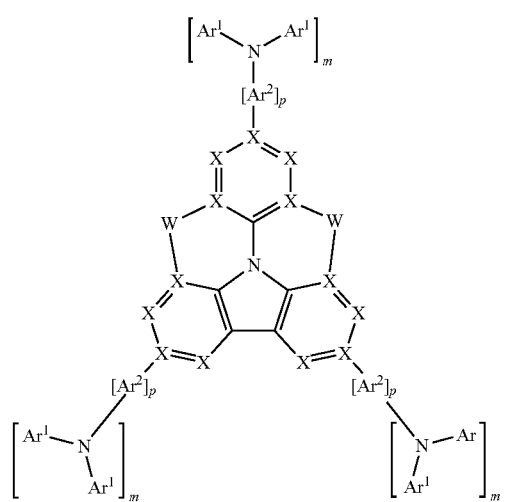

formula (15)

where the symbols used have the meanings given above, and furthermore:

W is, identically or differently on each occurrence, a single bond, $C(R^1)_2$, NR¹, O or S, where a maximum of one group W stands for a single bond;

n is, identically or differently on each occurrence, 0 or 1, where at least one index n stands for 1;

m is, identically or differently on each occurrence, 0 or 1, where at least one index m stands for 1;

p is, identically or differently on each occurrence, 0, 1 or 2;

furthermore, X stands for C if a group $N(Ar^1)_2$ or a group Ar² or a group W is bonded to this group X.

The linking of the carbazole group to Ar² in formula (13) preferably takes place via the 2- or 3-position.

Preference is again furthermore given to dimeric bridged carbazole derivatives of the following formula (16), formula (16)

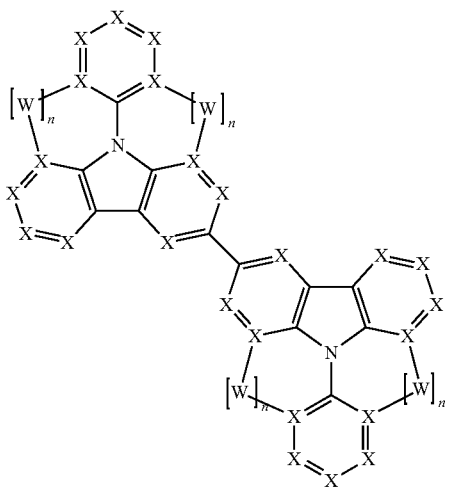

where the symbols and indices used have the meanings given above.

An aryl group in the sense of this invention contains at least 6 C atoms; a heteroaryl group in the sense of this invention contains at least 2 C atoms and at least 1 heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, pyrene, quinoline, isoquinoline, etc.

An aromatic ring system in the sense of this invention contains at least 6 C atoms in the ring system. A heteroaromatic ring system in the sense of this invention contains at least 2 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which a plurality of aryl or heteroaryl groups may also be interrupted by a short non-aromatic unit (preferably less than 10% of the atoms other than H), such as, for example, a C, N, O or S atom or a carbonyl group. Thus, for example, systems such as 9,9'-spirobifluorene, 9,9-diarylfluorene, triarylamine, diaryl ether, stilbene, benzophenone, etc., are also intended to be taken to be aromatic ring systems in the sense of this invention. Likewise, an aromatic or heteroaromatic ring system is taken to mean systems in which a plurality of aryl or heteroaryl groups are linked to one another by single bonds, for example biphenyl, terphenyl or bipyridine.

For the purposes of the present invention, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, trifluoromethyl, pentafluoroethyl and 2,2,2-trifluoroethyl. A $C_2$- to $C_{40}$-alkenyl group is preferably taken to mean ethenyl, propenyl, butenyl, pentenyl, cyclopentenyl, hexenyl, cyclohexenyl, heptenyl, cycloheptenyl, octenyl and cyclooctenyl. A $C_2$- to $C_{40}$-alkynyl group is preferably taken to mean ethynyl, propynyl, butynyl, pentynyl, hexynyl, heptynyl and octynyl. A $C_1$- to $C_{40}$-alkoxy group is particularly preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the radicals R mentioned above and which may be linked to the aromatic or heteroaromatic group via any desired positions, is taken to mean, in particular, groups derived from benzene, naphthalene, anthracene, phenanthrene, benzanthracene, benzophenanthrene, pyrene, chrysene, perylene, fluoranthene, benzofluoranthene, naphthacene, pentacene, benzopyrene, biphenyl, biphenylene, terphenyl, terphenylene, fluorene, benzofluorene, dibenzofluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Preferred groups $Ar^1$ are selected from the group consisting of phenyl, 2-, 3- or 4-tolyl, 3- or 4-o-xylyl, 2- or 4-m-xylyl, 2-p-xylyl, o-, m- or p-tert-butylphenyl, o-, m- or p-fluorophenyl, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p-, m,p-, o,p-, m,m-, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, indenocarbazole, indolocarbazole, 2- or 3-thienyl or 2-, 3- or 4-pyridyl and combinations of one or more of these groups. These groups may each also be substituted by one or more radicals $R^1$.

These substituents are also suitable as substituents on diazasilols and tetraazasilols.

Preferred groups $Ar^2$ are selected from the group consisting of o-, m- or p-phenylene, 2,2'-, 3,3'- or 4,4'-biphenyl, 2,2"-, 3,3"- or 4,4"-o-terphenyl, 2,2"-, 3,3"- or 4,4"-m-terphenyl, 2,2"-, 3,3"- or 4,4"-p-terphenyl, p-, m,p-, o,p-, m,m-, o,m- or o,o-quaterphenyl, quinquephenyl, sexiphenyl, 2,7-fluorenyl, 2,7- or 2,2'-spiro-9,9'-bifluorenyl or 2,7-(9,10-dihydro)

phenanthrenyl, each of which may be substituted by one or more radicals $R^1$. $R^1$ here is preferably methyl or phenyl.

The groups $Ar^1$ and $Ar^2$ may be substituted by one or more radicals $R^1$. These radicals $R^1$ are preferably selected, identically or differently on each occurrence, from the group consisting of H, D, F, a straight-chain alkyl group having 1 to 4 C atoms or a branched or cyclic alkyl group having 3 to 5 C atoms, each of which may be substituted by one or more radicals $R^2$, where one or more H atoms may be replaced by D or F, or an aromatic ring system having 6 to 24 aromatic ring atoms, which may be substituted by one or more radicals $R^2$, or a combination of these systems; two or more adjacent substituents $R^1$ here may also form a mono- or polycyclic, aliphatic or aromatic ring system with one another. If the organic electroluminescent device is applied from solution, straight-chain, branched or cyclic alkyl groups having up to 10 C atoms are also preferred as substituents $R^1$. The radicals $R^1$ are particularly preferably selected, identically or differently on each occurrence, from the group consisting of H, D or an aromatic ring system having 6 to 24 aromatic ring atoms, which may be substituted by one or more radicals $R^2$, but is preferably unsubstituted.

In particular if the group $Ar^1$ or $Ar^2$ contains a fluorene or a corresponding condensed derivative, such as, for example, fluorene, indenofluorene or indenocarbazole, the radical $R^1$ on the respective bridges $C(R^1)_2$ preferably stands for an alkyl group having 1 to 10 C atoms or an aromatic or heteroaromatic ring system having 5 to 24 aromatic ring atoms. $R^1$ here is particularly preferably methyl or phenyl.

Further suitable compounds are diazasilole and tetraazasilole derivatives, in particular having aromatic substituents, as described, for example, in WO 2010/054729. Suitable substituents on the diaza- and tetraazasilole derivatives are aromatic and heteroaromatic ring systems, in particular also those which are linked to two nitrogen atoms of the diaza- and tetraazasilole, or also alkyl groups.

Suitable matrix materials having a high HOMO are furthermore, for example, the carbazole derivatives disclosed in WO 2005/039246, US 2005/0069729, JP 2004/288381, EP 1205527 or WO 2008/086851, indolocarbazole derivatives, for example in accordance with WO 2007/063754 or WO 2008/056746, azacarbazole derivatives, for example in accordance with EP 1617710, EP 1617711, EP 1731584, JP 2005/347160, bipolar matrix materials, for example in accordance with WO 2007/137725, indenocarbazole derivatives, for example in accordance with WO 2010/136109 and WO 2011/000455, bridged triarylamine derivatives, for example in accordance with WO 2007/031165, WO 2011/042107 or WO 2011/060867, or benzofuranyldibenzofuran derivatives in accordance with WO 2009/148015.

Examples of suitable materials as can be employed as matrix component having a high HOMO in the emission layer, so long as the above-mentioned conditions for the HOMO in relation to the electron-blocking layer are observed, are the structures shown below.

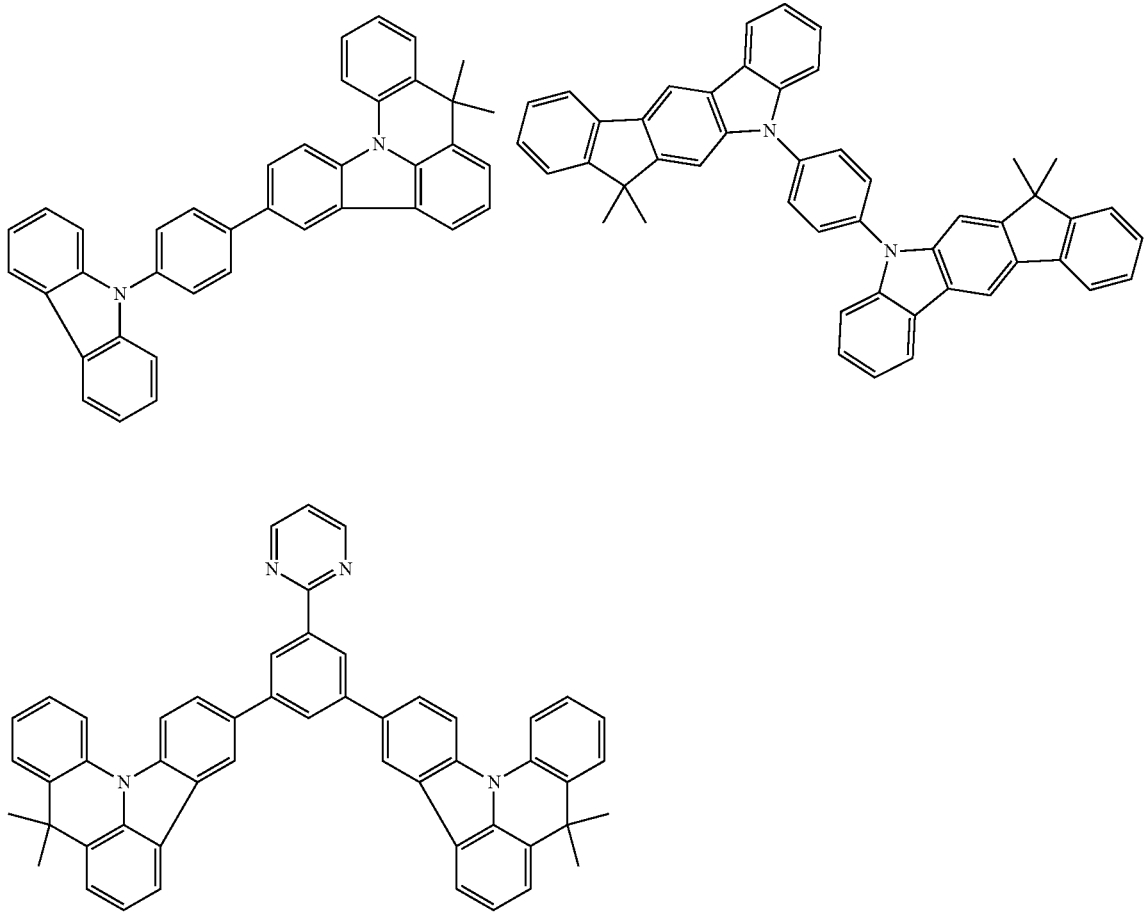

-continued
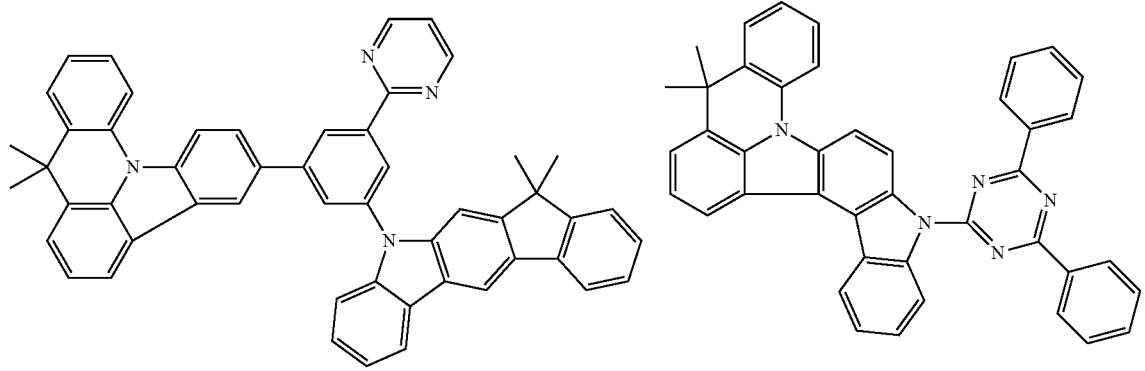
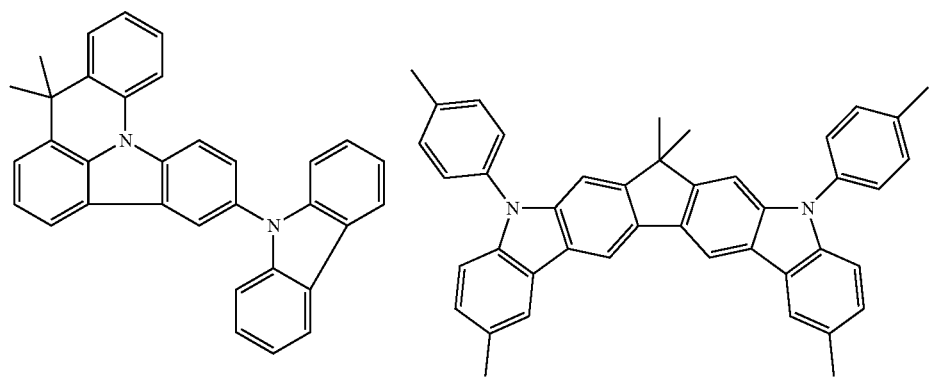
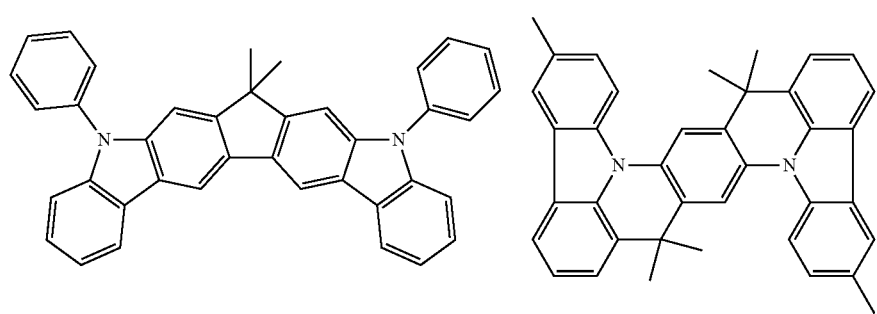
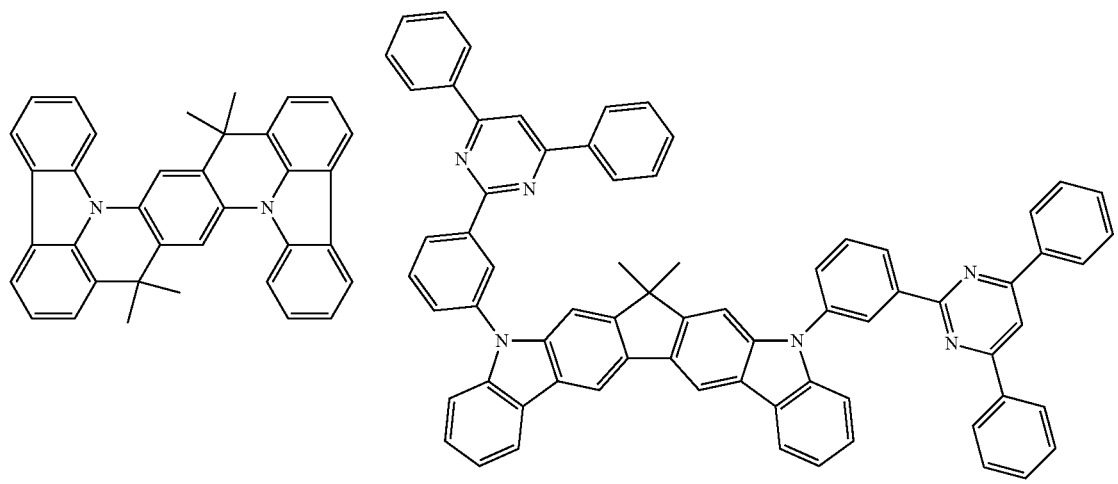

-continued
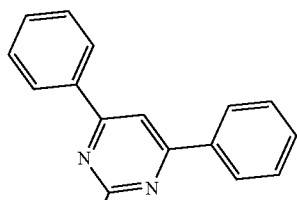
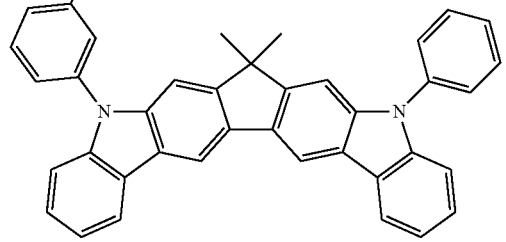
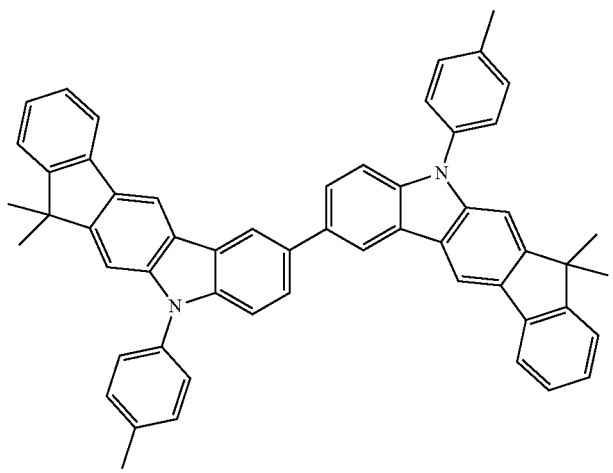
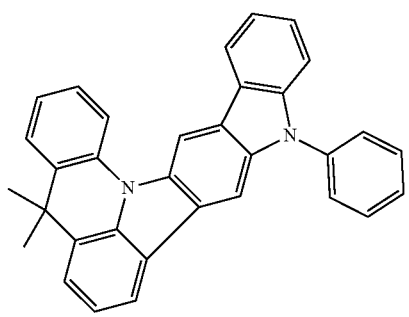
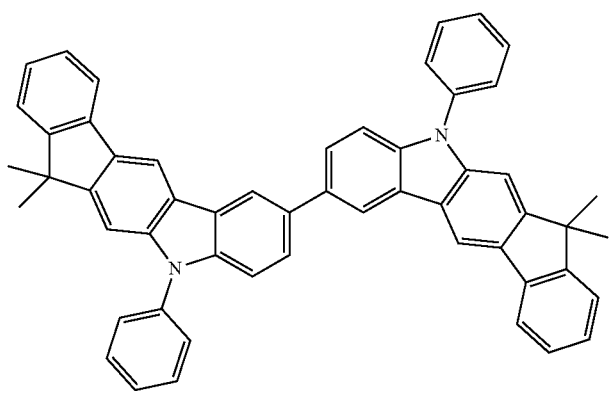
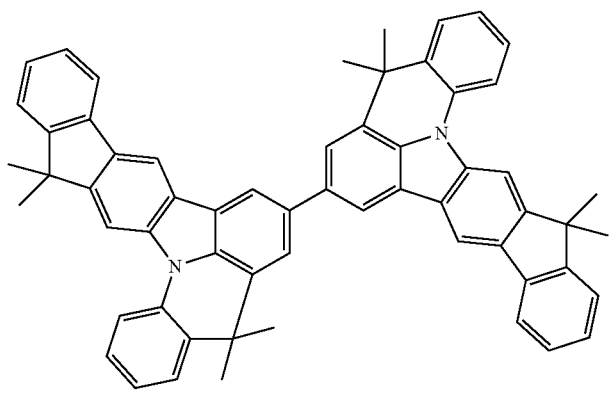

-continued
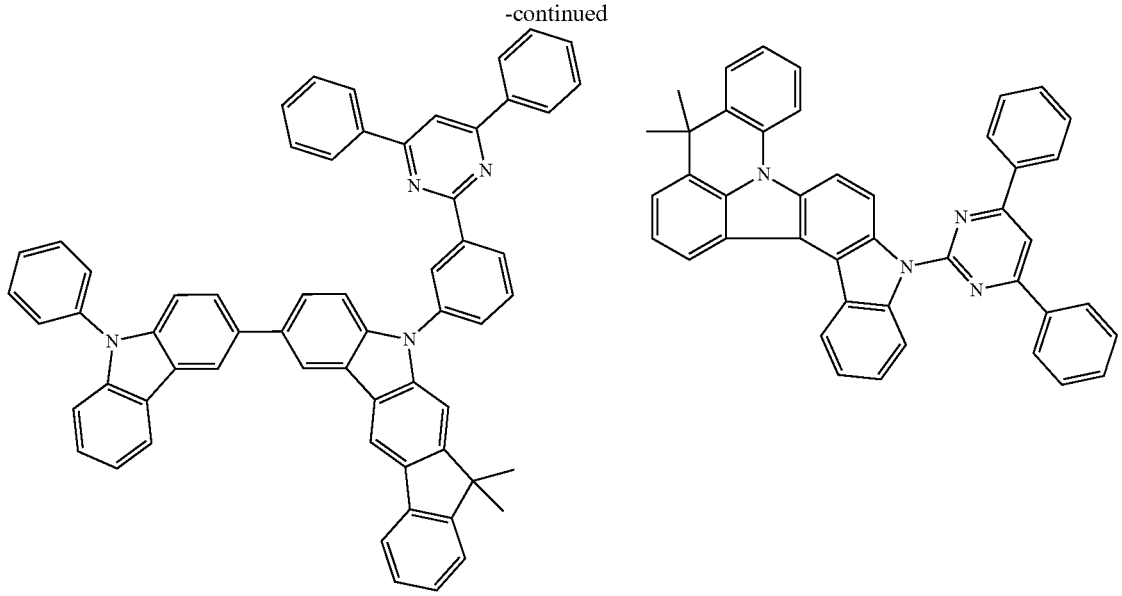
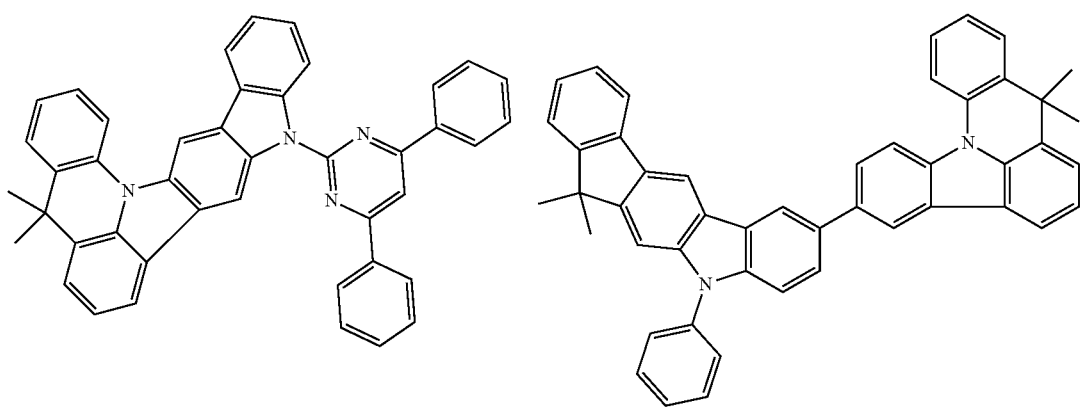
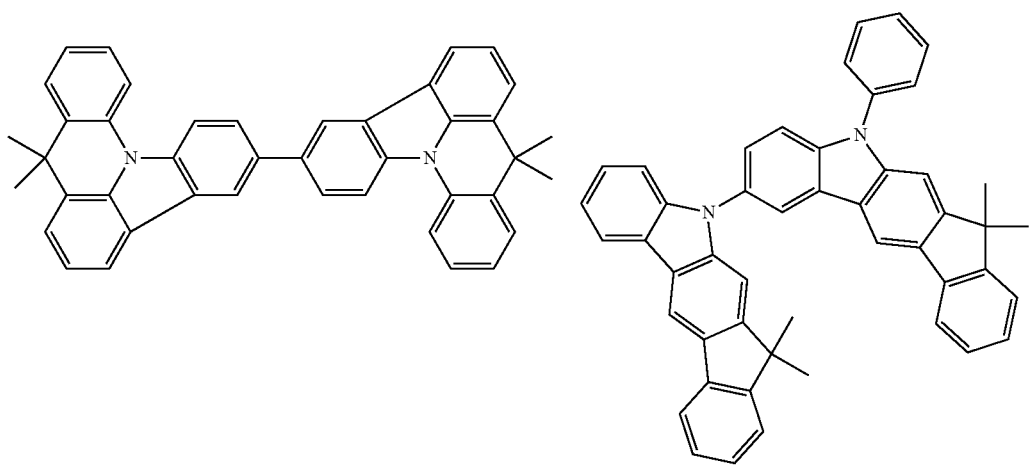

-continued
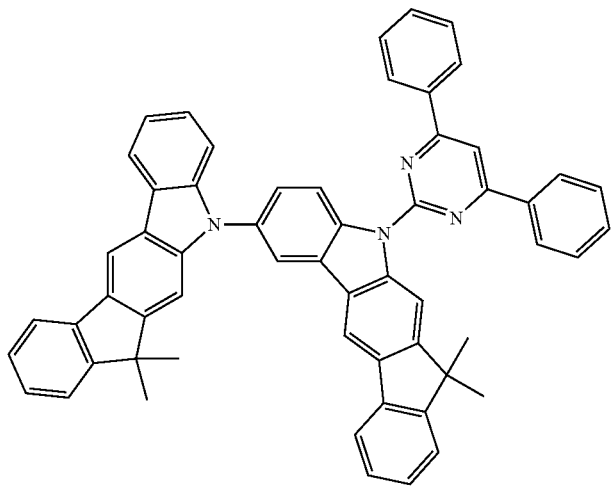
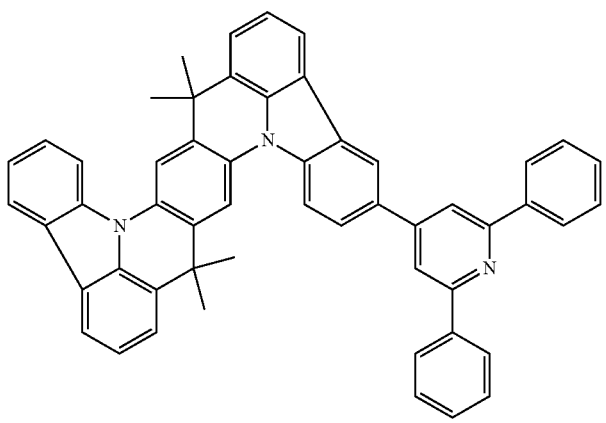
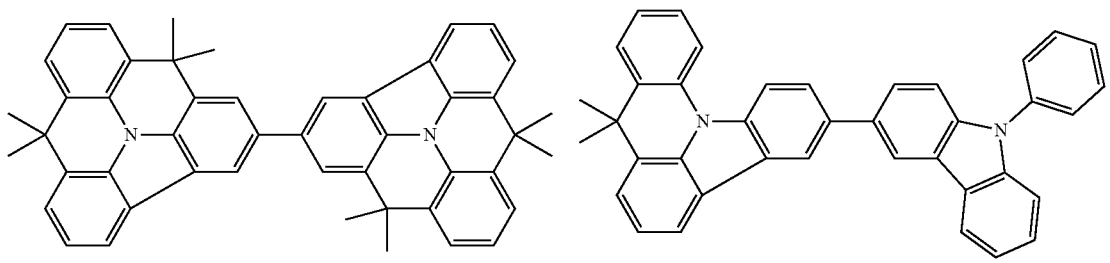
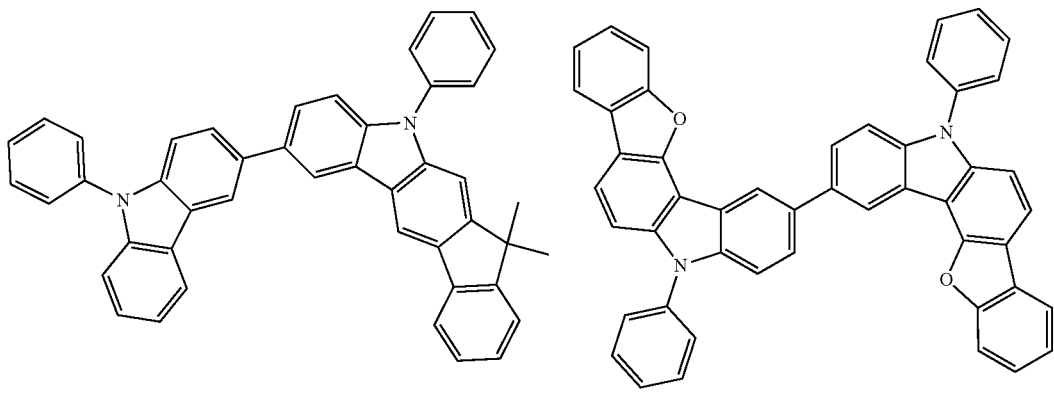

-continued
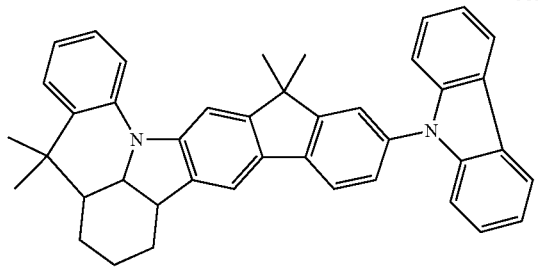
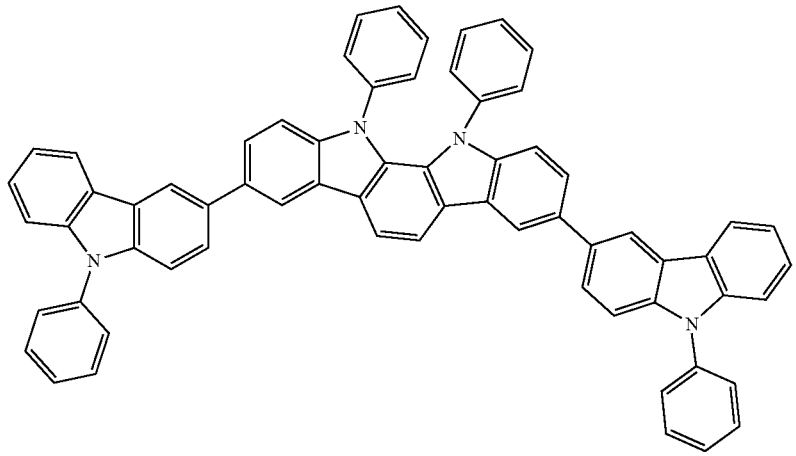
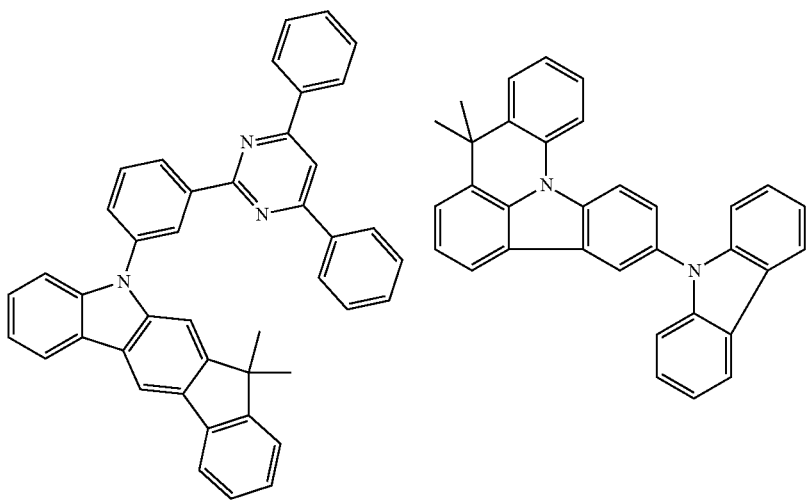
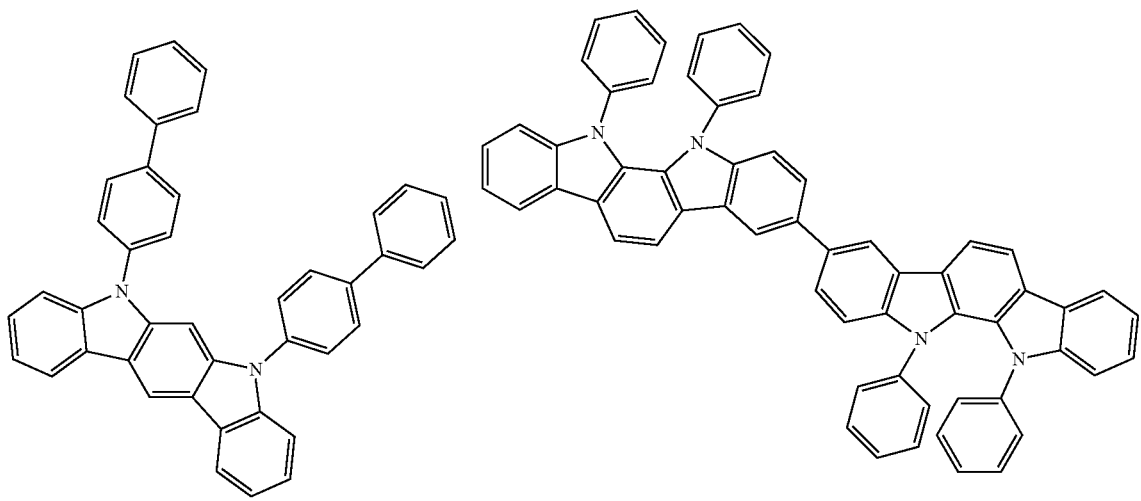

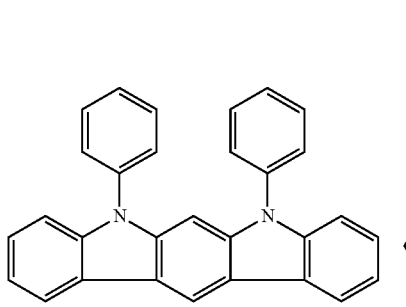
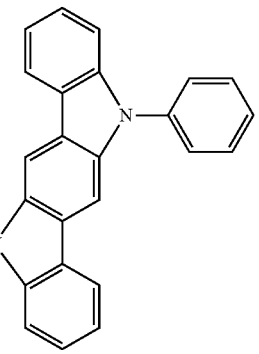

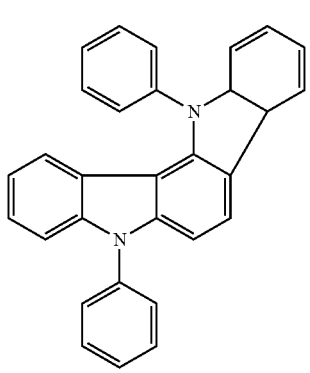
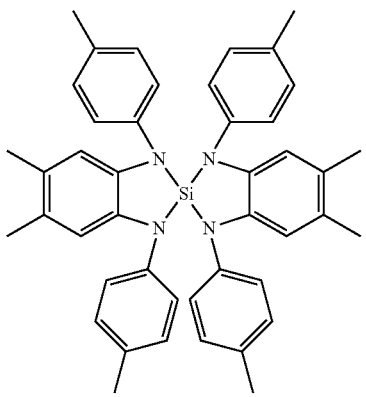
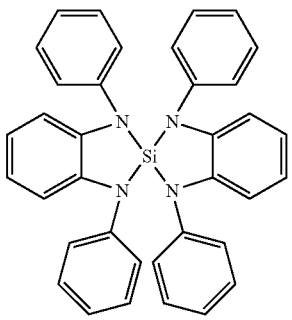

Suitable matrix materials having a low LUMO which can be used in the emission layer are selected, for example, from the group consisting of aromatic ketones, aromatic phosphine oxides, or aromatic sulfoxides or sulfones, for example in accordance with WO 2004/013080, WO 2004/093207, WO 2006/005627 or WO 2010/006680, bipolar matrix materials, for example in accordance with WO 2007/137725, silanes, for example in accordance with WO 2005/111172, azaboroles or boronic esters, for example in accordance with WO 2006/117052, triazine derivatives, for example in accordance with WO 2007/063754, WO 2008/056746, WO 2010/015306, WO 2011/057706 or WO 2011/060877, pyrimidine derivatives, for example in accordance with the unpublished application EP 10014930.1, diazaphosphole derivatives, for example in accordance with WO 2010/054730, indolocarbazole derivatives which are substituted by electron-deficient heteroaromatic groups, such as, for example, triazine or pyrimidine, for example in accordance with WO 2007/063754 or WO 2008/056746, or indenocarbazole derivatives which are substituted by electron-deficient heteroaromatic groups, such as, for example, triazine or pyrimidine, for example in accordance with WO 2010/136109 and WO 2011/000455.

Examples of matrix materials having a low LUMO are the materials shown in the following table.

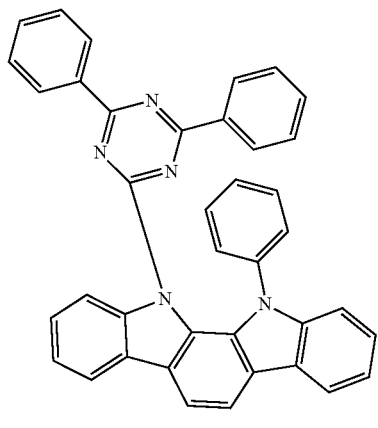
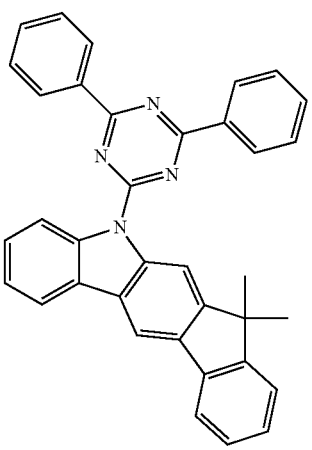

-continued
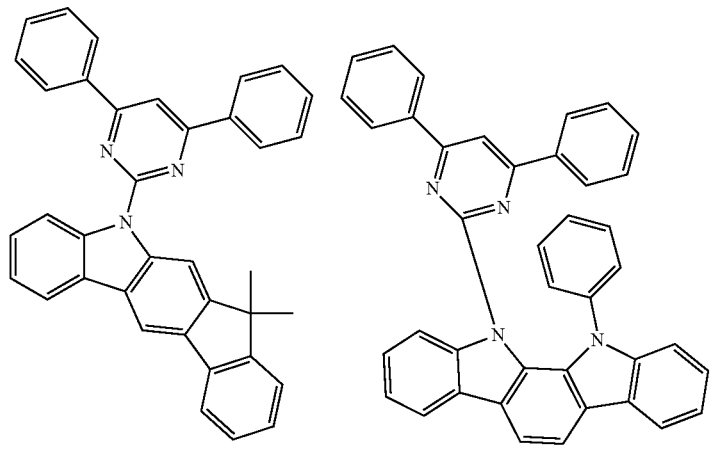
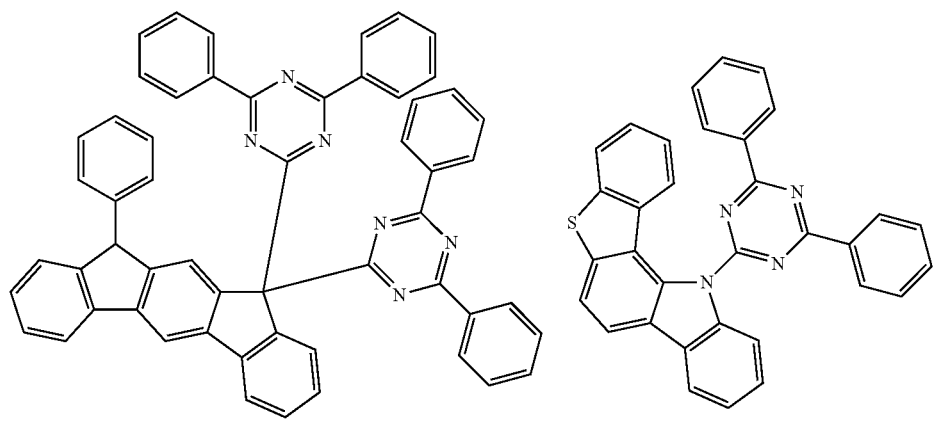
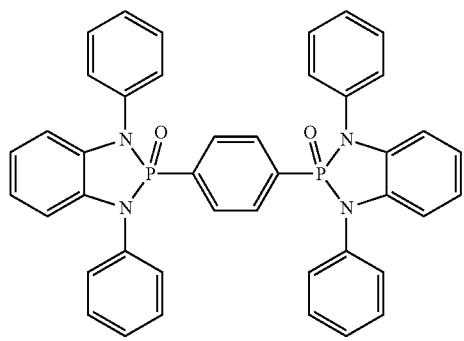
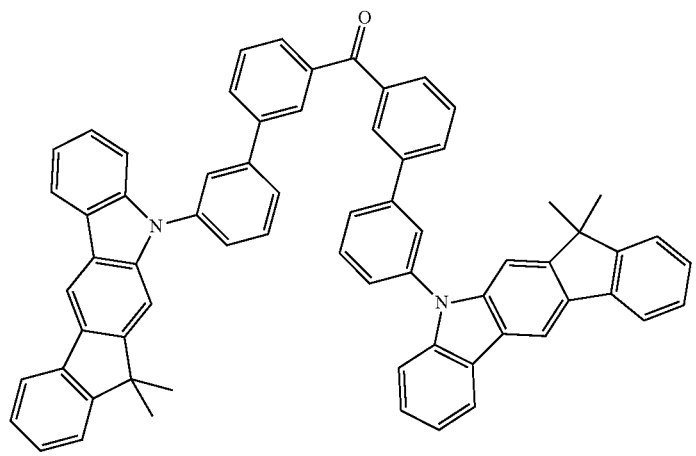

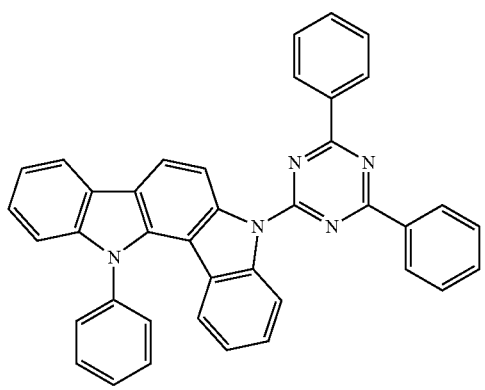
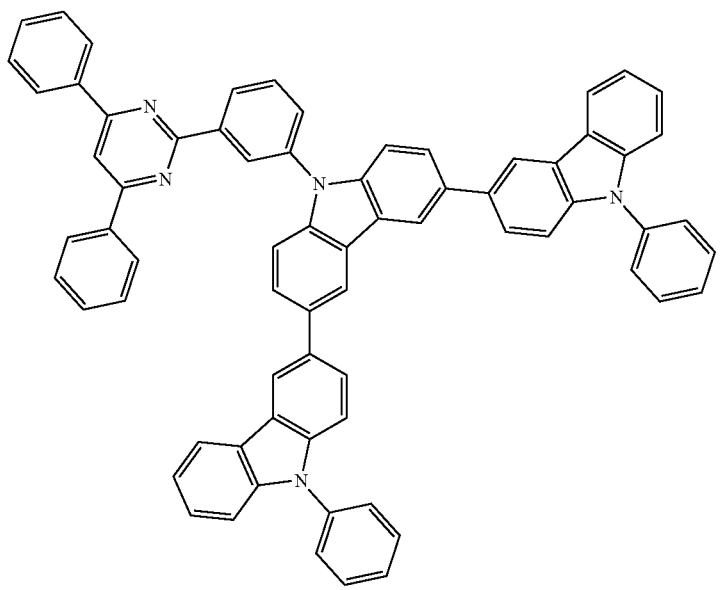
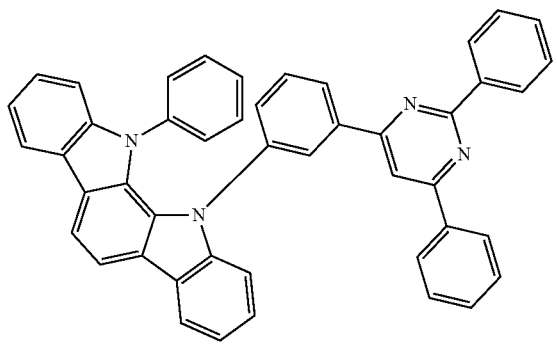
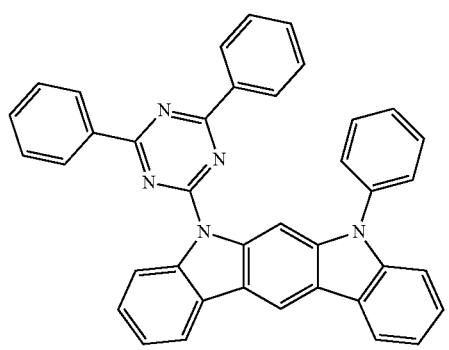

-continued
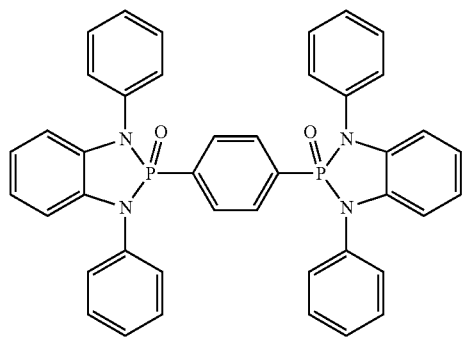
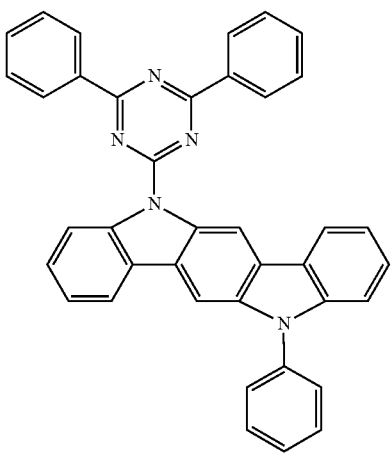
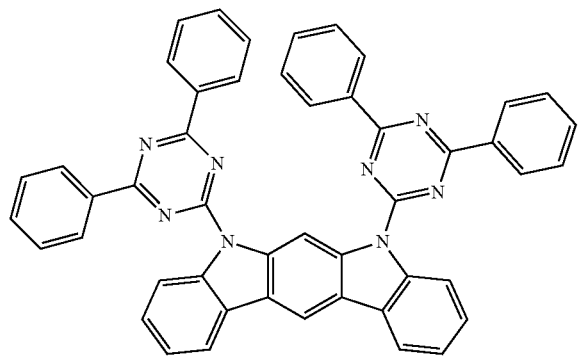
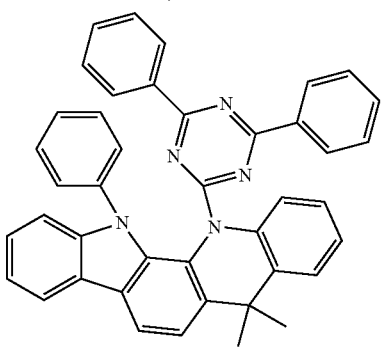
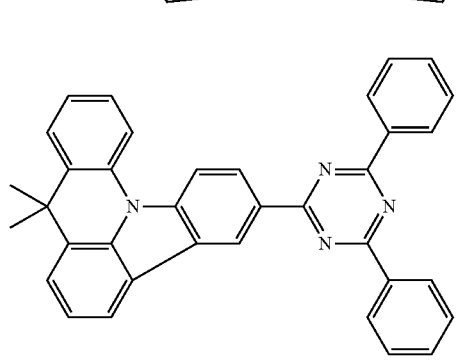
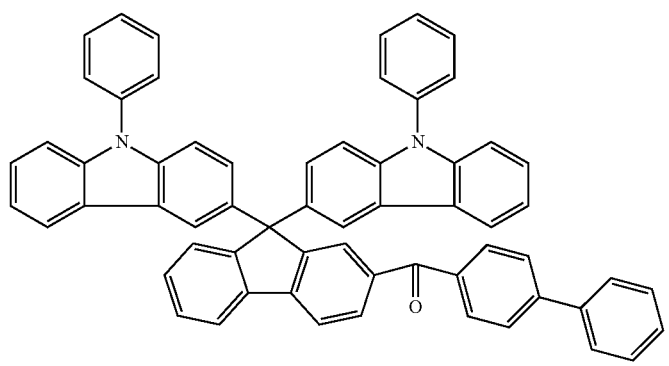
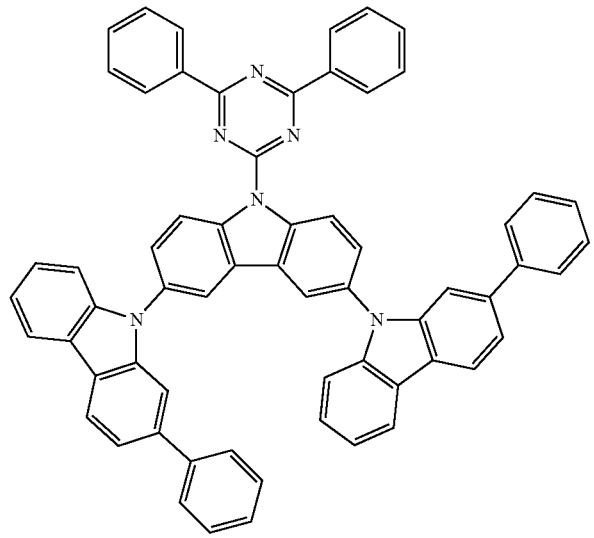

33 34
-continued
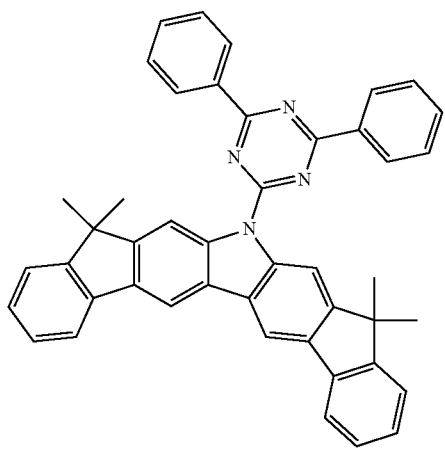
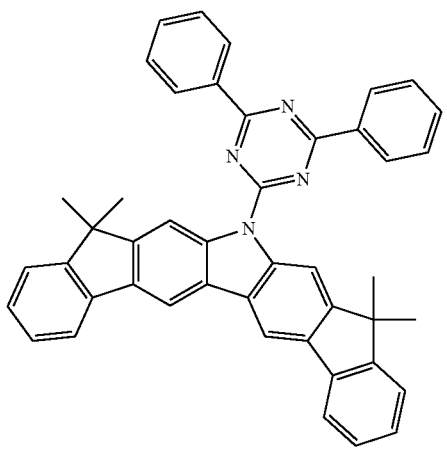
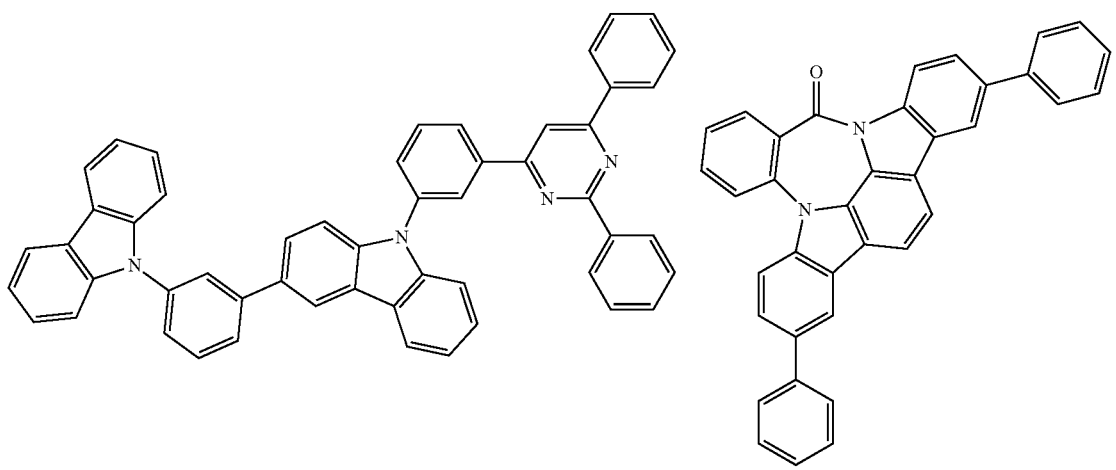
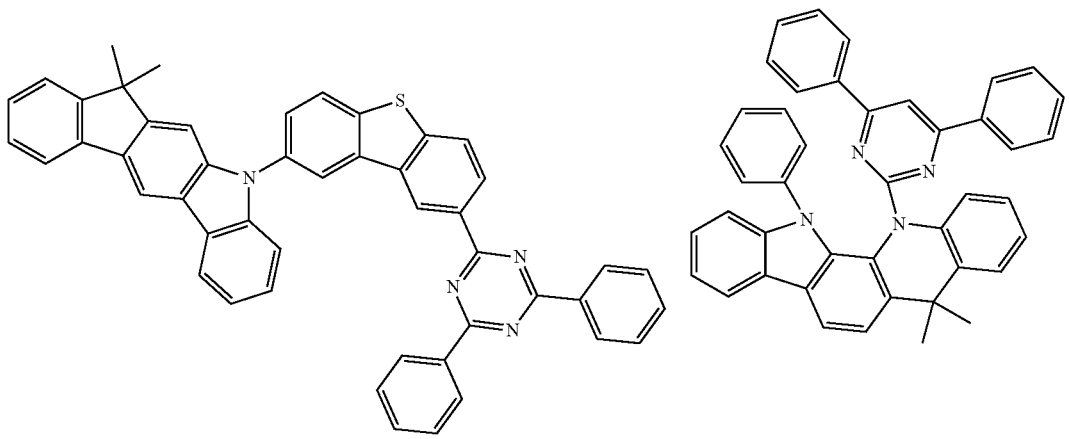

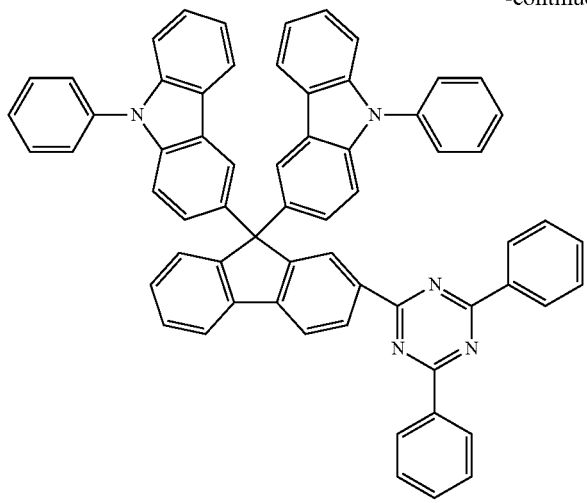
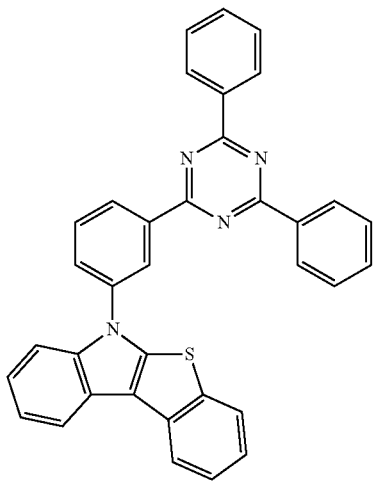
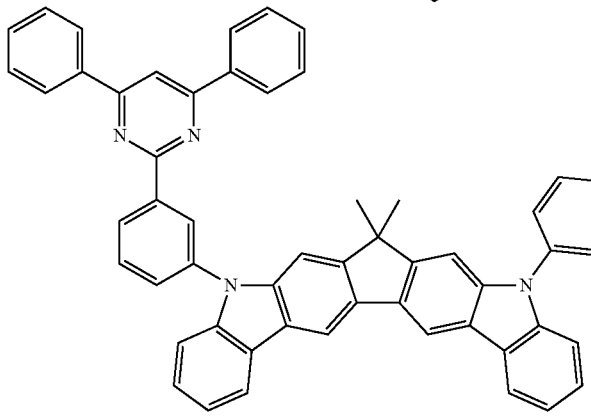

If only a single material is used as matrix material, this material has both the above-mentioned conditions for the HOMO and also for the LUMO. Suitable compounds are, for example, bipolar matrix materials containing keto groups or containing triazine groups or containing pyrimidine groups and at the same time arylamine or carbazole groups, for example in accordance with WO 2007/137725.

Suitable as phosphorescent compound in the emission layer are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium, platinum or copper.

Particularly preferred organic electroluminescent devices comprise, as phosphorescent compound, at least one compound of the formulae (17) to (20),

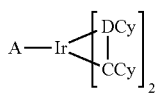  formula (17)

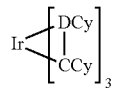  formula (18)

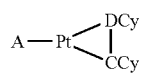  formula (19)

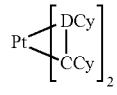  formula (20)

where $R^1$ has the same meaning as described above for formula (1), and the following applies to the other symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate-chelating ligand, preferably a diketonate ligand.

A bridge may also be present between the groups DCy and CCy through the formation of ring systems between a plurality of radicals $R^1$. Furthermore, a bridge may also be present between two or three ligands CCy-DCy or between one or two ligands CCy-DCy and the ligand A through the formation of ring systems between a plurality of radicals $R^1$, so that the ligand system is polydentate or polypodal.

The metal complexes here are selected so that they result in the above-mentioned emission maximum when used in the emission layer of the organic electroluminescent device.

Examples of the emitters described above are revealed by the applications WO 00/70655, WO 01/41512, WO 02/02714, WO 02/15645, EP 1191613, EP 1191612, EP 1191614, WO 04/081017, WO 05/033244, WO 05/042550, WO 05/113563, WO 06/008069, WO 06/061182, WO 06/081973, WO 2009/146770, WO 2010/031485, WO 2010/086089, WO 2010/099852, WO 2011/032626 and the unpublished application EP 10006208.2. In general, all phosphorescent complexes as are used in accordance with the prior art for phosphorescent OLEDs and as are known to the person skilled in the art in the area of organic electroluminescence are suitable, and the person skilled in the art will be able to use further phosphorescent compounds without inventive step. In particular, the person skilled in the art knows which phosphorescent complexes emit with which emission colour, and he is correspondingly able to select complexes which have an emission maximum of 570 nm or which result in such an emission maximum when used in an organic electroluminescent device.

The cathode of the electroluminescent device according to the invention preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, may also be used in addition to the said metals, in which case combinations of the metals, such as, for example, Mg/Ag, Ca/Ag or Ba/Ag, are generally used. Preference is likewise given to metal alloys, in particular alloys comprising an alkali metal or alkaline-earth metal and silver, particularly preferably an alloy comprising Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, CsF, $Cs_2CO_3$, $BaF_2$, MgO, NaF, etc.). Organic alkali metal or alkaline-earth metal complexes, such as, for example, lithium quinolinate (LiQ), are likewise suitable. The layer thickness of this layer is preferably between 0.5 and 5 nm.

The anode of the electroluminescent device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. At least one of the electrodes here must be transparent or partially transparent in order to facilitate the coupling-out of light. Preferred transparent or partially transparent anode materials are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

It is generally possible to employ all further materials as employed in accordance with the prior art in organic electroluminescent devices, also in combination with the exciton-blocking, emitter and hole-blocking layer according to the invention.

The layers of the organic electroluminescent device can be applied by various methods in accordance with the prior art.

Preference is given to an organic electroluminescent device, characterised in that one or more layers are coated by means of a sublimation process, in which the materials are vapour-deposited in vacuum sublimation units at an initial pressure of less than $10^{-5}$ mbar, preferably less than $10^{-6}$ mbar. However, it should be noted that the pressure may also be even lower, for example less than $10^{-7}$ mbar.

Preference is likewise given to an organic electroluminescent device, characterised in that one or more layers are coated by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing, LITI (light induced thermal imaging, thermal transfer printing), inkjet printing or nozzle printing. Soluble compounds are necessary for this purpose. High solubility can be achieved through suitable substitution of the compounds. It is possible here not only for solutions of individual materials to be applied, but also solutions which comprise a plurality of compounds, for example matrix materials and dopants.

The organic electroluminescent device can also be produced by applying one or more layers from solution and applying one or more other layers by vapour deposition.

Since a plurality of layers are applied one above the other, it is preferred for the emission layer and the hole-blocking layer and any electron-transport layers present to be applied by vapour deposition. It is particularly preferred for the electron-blocking layer, the emission layer and the hole-blocking layer and any electron-transport layers present to be applied by vapour deposition. It is very particularly preferred for all organic layers to be applied by vapour deposition.

These processes are generally known to the person skilled in the art and can be applied by him without inventive step to the organic electroluminescent devices according to the invention.

The organic electroluminescent device according to the invention has one or more of the following surprising advantages over the prior art:

1. In spite of the use of a low concentration of the phosphorescent emitter of less than 10% by vol., the organic electroluminescent device according to the invention has high efficiency and a long lifetime.
2. In spite of the low concentration of the phosphorescent emitter, the organic electroluminescent device according to the invention has good roll-off behaviour, i.e. only a slight decrease in the efficiency at high luminous density.

3. The properties of the organic electroluminescent device according to the invention have only low dependence on the precise concentration of the phosphorescent emitter. This results in higher process security in mass production, since variations in the vapour-deposition rate of the individual compounds do not result in significant changes in the properties.

4. The properties of the organic electroluminescent device according to the invention are not significantly dependent on the position of the HOMO and/or LUMO of the phosphorescent emitter. Good results are thus achieved not only on use of iridium complexes as phosphorescent emitters, but also on use of green-emitting platinum complexes, which frequently have a lower HOMO.

The organic electroluminescent device according to the invention can be used for various applications, for example for mono- or polychromatic displays, for lighting applications, for medical applications, for example in phototherapy, or for organic lasers (O-lasers).

The invention is described in greater detail by the following examples, without wishing to restrict it thereby. The person skilled in the art will be able, without being inventive, to carry out the invention throughout the range disclosed and thus produce further organic electroluminescent devices according to the invention.

EXAMPLES

Production of OLEDs

The OLEDs are produced by a general process in accordance with WO 2004/058911, which is adapted to the circumstances described here (layer-thickness variation, materials).

The data for various OLEDs are presented in Examples N1-E20 below (see Tables 1 and 2). Glass plates coated with structured ITO (indium tin oxide) in a thickness of 150 nm are coated with 20 nm of PEDOT (poly(3,4-ethylenedioxy-2,5-thiophene), applied by spin coating from water; purchased from H. C. Starck, Goslar, Germany) for improved processing. These coated glass plates form the substrates to which the OLEDs are applied. The OLEDs have in principle the following layer structure: substrate/optional hole-injection layer (HIL)/hole-transport layer (HTL)/optional interlayer (IL)/electron-blocking layer (EBL)/emission layer (EML)/hole-blocking layer (HBL)/optional electron-transport layer (ETL)/optional electron-injection layer (EIL) and finally a cathode. The cathode is formed by an aluminium layer with a thickness of 100 nm. The materials required for the production of the OLEDs are depicted in Table 4.

All materials are applied by thermal vapour deposition in a vacuum chamber. The emission layer here always consists of at least one matrix material (host material) and an emitting dopant (emitter), which is admixed with the matrix material or matrix materials in a certain proportion by volume by co-evaporation.

An expression such as ST1:LiQ (55%:45%) means that material ST1 is present in the layer in a proportion by volume of 55% and LiQ is present in the layer in a proportion of 45%.

Table 1 shows the structure of the various OLEDs. The emission layer (EML) in each case consists of an emitter and one or two matrix materials MM1 and MM2. An expression such as IC1:TEG1 means that only one matrix material is present, in this case MM1=IC1, the emitter is material TEG1. An expression such as IC2:IC3:TEG2 means that two matrix materials are present, in this case MM1=IC2, MM2=IC3, the emitter is material TEG2. Since the dependence of the performance data on the concentration of the emitter is crucial for the present invention, the emitter concentration is varied as described below.

Table 2 summarises the data of the OLEDs for various emitter concentrations. Examples N1-N10 are comparative examples which do not satisfy the conditions according to the invention. Examples E1-E10 show OLEDs according to the invention. If two matrix materials are present, the ratio of the volume concentrations of these two matrix materials is indicated in the column "MM1:MM2". The column "conc. emitter" denotes the volume concentration of the emitter, where all volume concentrations add up to 100%. The expression MM1:MM2=2:1 and conc. emitter=10% means, for example, that MM1 is present in the emission layer in a proportion by volume of 60%, MM2 is present in the emission layer in a proportion of 30% and the emitter is present in the emission layer in a proportion of 10%. In the case of only one matrix material, the column "MM1:MM2" is empty, the proportion by volume of the matrix is then 100% minus the concentration of the emitter.

The expressions "Rel. EQE", "Rel. roll-off" and "Rel. LT" show how the parameters EQE, roll-off and lifetime (LT) change with the emitter concentration. These are relative data for a particular structure in which only the emitter concentration is varied. EQE here is the external quantum efficiency at 1000 cd/m$^2$. The roll-off is defined as EQE(5000 cd/m$^2$)/EQE (1000 cd/m$^2$). A high roll-off is desired, since in this case the efficiency at high luminous densities is high. The lifetime is defined as the time after which the luminous density drops from an initial luminance of 4000 cd/m$^2$ 3200 cd/m$^2$ on operation with constant current. Data which belong to a structure are bordered by horizontal double lines in Table 2.

Furthermore, Table 3 shows relative comparisons between various structures. These comparisons are likewise bordered by horizontal double lines. In these comparisons, the concentration ratios for which the lifetime is optimum are compared in each case.

In the case of mixed-matrix systems, an optimisation of the mixing ratio of the two matrix components at an emitter concentration of 10% is carried out for a given structure. For the variation of the emitter concentration, the mixing ratio with which the longest lifetime is achieved is selected, i.e., for example, 2:1 for structure E1.

Determination of the HOMO/LUMO Positions and the Triplet Level

The HOMO and LUMO positions and the triplet level of the materials are determined via quantum-chemical calculations. To this end, the "Gaussian-03W" software package (Gaussian Inc.) is used. In order to calculate organic substances without metals (denoted by method "org." in Table 5), firstly a geometry optimisation is carried out using the "Ground State/Semi-empirical/Default Spin/AM1/Charge 0/Spin Singlet" method. This is followed by an energy calculation on the basis of the optimised geometry. The "TD-SFC/DFT/Default Spin/B3PW91" method with the "6-31G(d)" base set is used here (Charge 0, Spin Singlet). For organometallic compounds (denoted by "organom." method in Table 5), the geometry is optimised via the "Ground State/Hartree-Fock/Default Spin/LanL2MB/Charge 0/Spin Singlet" method. The energy calculation is carried out analogously to the organic substances as described above, with the difference that the "LanL2DZ" base set is used for the metal atom and the "6-31G(d)" base set is used for the ligands. The energy calculation gives the HOMO HEh or LUMO LEh in hartree units. The HOMO and LUMO values calibrated with reference to cyclic voltammetry measurements are determined therefrom in electron volts as follows:

HOMO(eV)=((HEh*27.212)−0.9899)/1.1206
LUMO(eV)=((LEh*27.212)−2.0041)/1.385

For the purposes of this application, these values are to be regarded as HOMO and LUMO respectively of the materials. As an example, an HOMO of −0.17519 hartrees and an LUMO of −0.04192 hartrees are obtained from the calculation for substance BPA1, which corresponds to a calibrated HOMO of −5.14 eV and a calibrated LUMO of −2.27 eV.

The triplet level $T_1$ is defined as the energy of the triplet state having the lowest energy, which arises from the quantum-chemical calculation.

Table 5 shows the HOMO and LUMO values and the triplet levels $T_1$ of the various materials.

EXPLANATION OF THE EXAMPLES

Some of the examples are explained in greater detail below in order to illustrate the advantages of the OLEDs according to the invention. However, it should be pointed out that this only represents a selection of the data shown in Table 2. Examples N1-N8 and E1-E20$_{E10}$ show green emission, the maximum of the emission is between 519 and 527 nm. For the OLEDs of Examples N9 and N10, the maximum of the emission is between 485 and 489 nm.

Meaning of the HOMO Difference Between EBL and EML

For Examples N1 (HOMO(EBL)−HOMO(EML)=0.65 eV), N2, N3 (HOMO(EBL)−HOMO(EML)=0.48 eV) and N4 (HOMO(EBL)−HOMO(EML)=0.42 eV), the condition HOMO(EBL)−HOMO(EML)<0.4 eV is not satisfied. Correspondingly, efficiency and/or roll-off and/or lifetime are impaired if an emitter concentration<10% by vol. is employed. This applies both on use of a single matrix (Examples N1, N2, N3) and to mixed-matrix systems (Example N4). By contrast, OLEDs for which the HOMO difference is less than 0.4 eV (Examples E1-E10) exhibit in virtually all cases an optimum with respect to efficiency, roll-off and lifetime at emitter concentration<10% by vol. If this is not the case, the improvement at emitter concentrations of ≥10% is only insignificant compared with the optimum. Only at a very low emitter concentrations of 1% by vol. in Example E1 is a significant impairment of the lifetime obtained.

Meaning of LUMO(EML)

For Examples N5 (LUMO(EML)=−2.50 eV), N6 (LUMO (EML)=−2.42 eV) and N8 (LUMO(EML)=−2.14 eV), the condition LUMO(EML)<−2.5 eV does not apply. In contrast to OLEDs according to the invention, an impairment of the performance data, in particular the lifetime, is obtained in this case at emitter concentrations below 10% by vol. In the case of the mixed-matrix system (Example N6), the impairment is not quite as clear as in the case of the single matrix, but is still significant. The impairment is particularly clear in Example N8 (LUMO(EML)−LUMO(HBL)=0.69 eV), where, besides the condition LUMO(EML)<−2.5 eV, the condition LUMO (EML)−LUMO(HBL)<0.4 eV is also not satisfied.

Meaning of the HOMO Positions of the Matrix Materials

If the HOMO for a matrix material is below −6.0 eV, an impairment of the performance data is likewise obtained for emitter concentrations below 10% by vol. (Example N7). This is, as described above, not the case for OLEDs according to the invention.

Use of an Aluminium Metal Complex in the Electron-Transport Layer

Example N9 shows that, on use of Alq$_3$ in the ETL in combination with the hole blocker Ket1, the optimum efficiency is obtained with an emitter concentrations of 5% by vol.; the roll-off does not change significantly with the emitter concentration. However, an unacceptable impairment of the lifetime is obtained for emitter concentrations<10% by vol. Without a hole-blocking layer, an impairment of efficiency and roll-off is additionally obtained at emitter concentrations<10% by vol. (Example N10). This is not the case in Example E7 having a similar structure and materials.

Improvements Due to Small HOMO or LUMO Differences of All Matrix Materials

Very good performance data are obtained, in particular, if the conditions HOMO(EBL)−HOMO(MM1, MM2)<0.4 eV or LUMO(MM1, MM2)−LUMO(HBL)<0.4 eV are satisfied for both matrix components MM1 and MM2 in a mixed-matrix system. This is shown with reference to Examples E9 (HOMO(EBL)−HOMO(MM1)=0.34 eV; HOMO(EBL)− HOMO(MM2)=0.25 eV) and E10 (LUMO(MM1)−LUMO (HBL)=0.04 eV; LUMO(MM2)−LUMO(HBL)=0.09 eV): in structure E1, which is comparable with E9, for which HOMO (EBL)−HOMO(MM1)=0.67 eV, comparable efficiency and roll-off, but a reduced lifetime are obtained. In structure E3, which is comparable with E10, for which LUMO(MM2)− LUMO(HBL)=0.65 eV, worse efficiency and lifetime are obtained (see Table 3).

TABLE 1

Structure of the OLEDs

| Ex. | MIL Thickness | HTL Thickness | IL Thickness | EBL Thickness | EML Thickness | HBL Thickness | ETL Thickness | EIL Thickness |
|---|---|---|---|---|---|---|---|---|
| N1 | — | SpA1 70 nm | HATCN 5 nm | BPA1 90 nm | IC1:TEG1 30 nm | — | ST1:LiQ (50%:50%) 40 nm | — |
| N2 | — | SpA1 70 nm | HATCN 5 nm | BPA1 90 nm | IC2:TEG1 30 nm | — | ST1 40 nm | LiQ 3 nm |
| N3 | — | SpA1 70 nm | HATCN 5 nm | BPA1 130 nm | IC2:TEG3 30 nm | — | ST1:LiQ (50%:50%) 40 nm | — |
| N4 | — | SpA1 200 nm | — | ICA1 20 nm | IC2:IC3:TEG2 40 nm | IC2 5 nm | ST2:LiQ (50%:50%) 25 nm | — |
| N5 | — | SpA1 70 nm | HATCN 5 nm | SPA2 90 nm | DAP1:TEG1 30 nm | — | ST1:LiQ (50%:50%) 40 nm | — |
| N6 | — | SpA1 70 nm | HATCN 5 nm | SPA2 90 nm | IC6:Cbz1:TEG1 30 nm | IC1 10 nm | ST1:LiQ (50%:50%) 30 nm | — |
| N7 | — | SpA1 110 nm | HATCN 10 nm | BPA1 100 nm | ST1:Cbz2:TEG1 40 nm | — | ST2:LiQ (50%:50%) 30 nm | — |
| N8 | — | SpA1 70 nm | HATCN 5 nm | CbzA1 90 nm | Cbz1:TEG1 30 nm | IC1 10 nm | ST1:LiQ (50%:50%) 50 nm | — |

TABLE 1-continued

Structure of the OLEDs

| Ex. | MIL Thickness | HTL Thickness | IL Thickness | EBL Thickness | EML Thickness | HBL Thickness | ETL Thickness | EIL Thickness |
|---|---|---|---|---|---|---|---|---|
| N9  | —     | SpA1 20 nm  | BPA1 5 nm  | DAS1 15 nm  | IC2:TEB1 40 nm       | Ket1 10 nm | Alq3 20 nm              | LiF 1 nm |
| N10 | —     | SpA1 20 nm  | BPA1 5 nm  | DAS1 15 nm  | IC2:TEB1 40 nm       | —          | Alq3 30 nm              | LiF 1 nm |
| E1  | —     | SpA1 70 nm  | HATCN 5 nm | ICA1 90 nm  | IC1:Cbz1:TEG1 30 nm  | IC1 10 nm  | ST1:LiQ (50%:50%) 30 nm | — |
| E2  | —     | SpA1 70 nm  | HATCN 5 nm | SPA2 90 nm  | IC1:Cbz1:TEG3 30 nm  | IC2 10 nm  | ST1:LiQ (50%:50%) 30 nm | — |
| E3  | —     | SpA1 200 nm | —          | NPB 20 nm   | IC2:Cbz1:TEG1 30 nm  | —          | ST1:LiQ (50%:50%) 30 nm | — |
| E4  | —     | SpA1 70 nm  | HATCN 5 nm | BPA1 90 nm  | IC1:Cbz2:TEG1 30 nm  | —          | ST1:LiQ (50%:50%) 40 nm | — |
| E5  | —     | SpA1 70 nm  | HATCN 5 nm | SPA2 90 nm  | IC4:TEG1 30 nm       | —          | ST1:LiQ (50%:50%) 40 nm | — |
| E6  | —     | SpA1 70 nm  | HATCN 5 nm | SPA2 90 nm  | DAP1:IC2:TEG1 30 nm  | —          | ST1:LiQ (50%:50%) 40 nm | — |
| E7  | SpA1 70 nm | HATCN 5 nm | BPA1 110 nm | DAS1 20 nm | IC2:TEG3 30 nm    | —          | ST1:LiQ (50%:50%) 40 nm | — |
| E8  | —     | SpA1 70 nm  | HATCN 5 nm | BPA1 90 nm  | IC1:IC5:TEG1 30 nm   | IC1 10 nm  | ST1:LiQ (50%:50%) 30 nm | — |
| E9  | —     | SpA1 70 nm  | HATCN 5 nm | ICA1 90 nm  | IC4:Cbz1:TEG1 30 nm  | IC1 10 nm  | ST1:LiQ (50%:50%) 30 nm | — |
| E10 | —     | SpA1 200 nm | —          | NPB 20 nm   | IC2:IC4:TEG1 30 nm   | —          | ST1:LiQ (50%:50%) 30 nm | — |
| E11 | —     | SpA1 70 nm  | HATCN 5 nm | ICA1 90 nm  | IC1:SPA3:TEG1 30 nm  | IC1 10 nm  | ST2:LiQ (50%:50%) 30 nm | — |
| E12 | —     | SpA1 70 nm  | HATCN 5 nm | ICA1 90 nm  | IC1:SPA3:TEG1 30 nm  | IC1 10 nm  | ST2 30 nm               | LiQ 3 nm |
| E13 | —     | SpA1 70 nm  | HATCN 5 nm | SPA2 90 nm  | IC1:MA1:TEG1 30 nm   | IC1 10 nm  | ST2:LiQ (50%:50%) 30 nm | — |
| E14 | —     | SpA1 70 nm  | HATCN 5 nm | SPA2 90 nm  | IC1:MA1:TEG1 30 nm   | IC1 10 nm  | ST2 30 nm               | LiQ 3 nm |
| E15 | —     | SpA1 70 nm  | HATCN 5 nm | SPA2 90 nm  | IC1:Cbz3:TEG1 30 nm  | IC1 10 nm  | ST2:LiQ (50%:50%) 30 nm | — |
| E16 | —     | SpA1 70 nm  | HATCN 5 nm | SPA2 90 nm  | IC1:Cbz3:TEG1 30 nm  | IC1 10 nm  | ST2 30 nm               | LiQ 3 nm |
| E17 | —     | SpA1 70 nm  | HATCN 5 nm | ICA1 90 nm  | IC1:SPA4:TEG1 30 nm  | IC1 10 nm  | ST2:LiQ (50%:50%) 30 nm | — |
| E18 | —     | SpA1 70 nm  | HATCN 5 nm | SPA2 90 nm  | IC1:SPA5:TEG1 30 nm  | IC1 10 nm  | ST2:LiQ (50%:50%) 30 nm | — |
| E19 | —     | SpA1 70 nm  | HATCN 5 nm | SPA2 90 nm  | IC1:SPA5:TEG1 30 nm  | IC1 10 nm  | ST2 30 nm               | LiQ 3 nm |
| E20 | —     | SpA1 70 nm  | HATCN 5 nm | SPA2 90 nm  | IC7:TEG1 30 nm       | IC1 10 nm  | ST2 30 nm               | LiQ 3 nm |

TABLE 2

Data of the OLEDs

| Ex. | MM1:MM2 | Emitter conc. | Rel. EQE | Rel. roll-off | Rel. LT |
|---|---|---|---|---|---|
| N1 | — | 3% | 82% | 83% | 33% |
| N1 | — | 6% | 100% | 95% | 60% |
| N1 | — | 8% | 98% | 100% | 73% |
| N1 | — | 10% | 94% | 99% | 100% |
| N2 | — | 1.5% | 44% | 87% | 100% |
| N2 | — | 3% | 65% | 85% | 68% |
| N2 | — | 6% | 90% | 92% | 48% |
| N2 | — | 10% | 100% | 100% | 46% |
| N3 | — | 5% | 93% | 87% | 100% |
| N3 | — | 10% | 100% | 100% | 84% |
| N4 | 1:2 | 4% | 74% | 89% | 55% |
| N4 | 1:2 | 7% | 91% | 93% | 71% |
| N4 | 1:2 | 10% | 100% | 100% | 100% |
| N5 | — | 5% | 100% | 82% | 63% |
| N5 | — | 7% | 96% | 88% | 77% |
| N5 | — | 10% | 92% | 100% | 100% |
| N6 | 2:1 | 3% | 91% | 95% | 82% |
| N6 | 2:1 | 6% | 100% | 100% | 93% |
| N6 | 2:1 | 10% | 96% | 98% | 100% |
| N7 | 1:2 | 4% | 89% | 92% | 83% |
| N7 | 1:2 | 7% | 100% | 97% | 96% |
| N7 | 1:2 | 10% | 98% | 100% | 100% |
| N8 | — | 1% | 75% | 86% | 14% |
| N8 | — | 4% | 82% | 97% | 33% |
| N8 | — | 7% | 100% | 100% | 82% |
| N8 | — | 10% | 97% | 99% | 100% |
| N9 | — | 2% | 97% | 99% | 56% |
| N9 | — | 5% | 100% | 97% | 61% |
| N9 | — | 8% | 95% | 100% | 78% |
| N9 | — | 10% | 87% | 98% | 100% |
| N10 | — | 4% | 88% | 91% | 54% |
| N10 | — | 7% | 96% | 97% | 79% |
| N10 | — | 10% | 100% | 100% | 100% |
| E1 | 2:1 | 1% | 97% | 97% | 39% |
| E1 | 2:1 | 4% | 96% | 99% | 97% |
| E1 | 2:1 | 5% | 100% | 97% | 97% |
| E1 | 2:1 | 7% | 96% | 100% | 99% |
| E1 | 2:1 | 10% | 94% | 99% | 100% |
| E2 | 2:1 | 2% | 96% | 93% | 92% |
| E2 | 2:1 | 4% | 100% | 97% | 100% |

TABLE 2-continued

Data of the OLEDs

| Ex. | MM1:MM2 | Emitter conc. | Rel. EQE | Rel. roll-off | Rel. LT |
|---|---|---|---|---|---|
| E2 | 2:1 | 6% | 96% | 97% | 94% |
| E2 | 2:1 | 8% | 93% | 99% | 83% |
| E2 | 2:1 | 10% | 92% | 100% | 71% |
| E3 | 6:1 | 4% | 100% | 99% | 100% |
| E3 | 6:1 | 7% | 96% | 100% | 94% |
| E3 | 6:1 | 10% | 91% | 96% | 83% |
| E4 | 2:1 | 4% | 100% | 98% | 100% |
| E4 | 2:1 | 10% | 93% | 100% | 64% |
| E5 | — | 3% | 96% | 98% | 94% |
| E5 | — | 6% | 100% | 97% | 100% |
| E5 | — | 8% | 99% | 100% | 92% |
| E5 | — | 10% | 96% | 98% | 79% |
| E6 | 1.5:1 | 4% | 100% | 97% | 93% |
| E6 | 1.5:1 | 7% | 95% | 97% | 100% |
| E6 | 1.5:1 | 10% | 93% | 100% | 97% |
| E7 | — | 5% | 100% | 99% | 100% |
| E7 | — | 7% | 82% | 100% | 83% |
| E7 | — | 10% | 70% | 97% | 58% |
| E8 | 8:1 | 2% | 69% | 88% | 38% |
| E8 | 8:1 | 5% | 100% | 99% | 89% |
| E8 | 8:1 | 8% | 99% | 100% | 100% |
| E8 | 8:1 | 10% | 98% | 98% | 77% |
| E9 | 4:1 | 4% | 100% | 97% | 99% |
| E9 | 4:1 | 7% | 99% | 100% | 100% |
| E9 | 4:1 | 10% | 98% | 97% | 94% |
| E10 | 3.5:1 | 6% | 100% | 97% | 100% |
| E10 | 3.5:1 | 8% | 94% | 97% | 88% |
| E10 | 3.5:1 | 10% | 92% | 100% | 82% |
| E11 | 5:1 | 3% | 92% | 93% | 65% |
| E11 | 5:1 | 5% | 98% | 97% | 96% |
| E11 | 5:1 | 7% | 100% | 99% | 98% |
| E11 | 5:1 | 10% | 95% | 100% | 100% |
| E12 | 5:1 | 3% | 92% | 93% | 100% |
| E12 | 5:1 | 5% | 100% | 97% | 98% |
| E12 | 5:1 | 7% | 100% | 99% | 96% |
| E12 | 5:1 | 10% | 99% | 100% | 56% |
| E13 | 2:1 | 3% | 96% | 95% | 85% |
| E13 | 2:1 | 5% | 100% | 98% | 100% |
| E13 | 2:1 | 7% | 98% | 99% | 98% |
| E13 | 2:1 | 10% | 97% | 100% | 98% |
| E14 | 2:1 | 3% | 98% | 97% | 83% |
| E14 | 2:1 | 5% | 99% | 99% | 100% |
| E14 | 2:1 | 7% | 100% | 100% | 96% |
| E14 | 2:1 | 10% | 93% | 99% | 98% |
| E15 | 2.3:1 | 3% | 97% | 99% | 89% |
| E15 | 2.3:1 | 5% | 100% | 99% | 100% |
| E15 | 2.3:1 | 7% | 96% | 100% | 68% |
| E15 | 2.3:1 | 10% | 96% | 100% | 65% |
| E16 | 2.3:1 | 3% | 100% | 98% | 81% |
| E16 | 2.3:1 | 5% | 100% | 99% | 100% |
| E16 | 2.3:1 | 7% | 100% | 100% | 64% |
| E16 | 2.3:1 | 10% | 96% | 100% | 55% |
| E17 | 2.3:1 | 3% | 98% | 94% | 65% |
| E17 | 2.3:1 | 5% | 96% | 98% | 83% |
| E17 | 2.3:1 | 7% | 100% | 99% | 100% |
| E17 | 2.3:1 | 10% | 97% | 100% | 92% |
| E18 | 5:1 | 3% | 93% | 93% | 62% |
| E18 | 5:1 | 5% | 95% | 97% | 91% |
| E18 | 5:1 | 7% | 100% | 99% | 100% |
| E18 | 5:1 | 10% | 92% | 100% | 90% |
| E19 | 5:1 | 3% | 92% | 93% | 100% |
| E19 | 5:1 | 5% | 97% | 97% | 89% |
| E19 | 5:1 | 7% | 100% | 99% | 51% |
| E19 | 5:1 | 10% | 96% | 100% | 43% |
| E20 | — | 5% | 93% | 100% | 100% |
| E20 | — | 10% | 100% | 98% | 78% |

TABLE 3

Comparison of various structures

| Ex. | MM1:MM2 | Emitter conc. | Rel. EQE | Rel. roll-off | Rel. LT |
|---|---|---|---|---|---|
| E1 | 2:1 | 7% | 100% | 99% | 83% |
| E9 | 4:1 | 7% | 96% | 100% | 100% |
| E3 | 6:1 | 4% | 95% | 100% | 86% |
| E10 | 3.5:1 | 6% | 100% | 96% | 100% |

TABLE 4

Structural formulae of the materials for the OLEDs

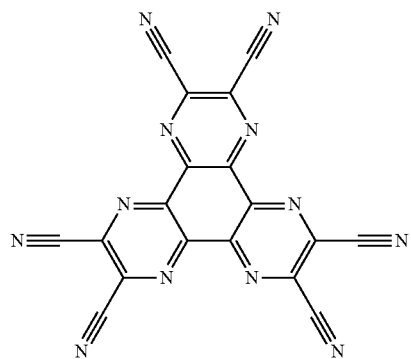 [SMILES: N#Cc1nc2c3nc(C#N)c(C#N)nc3c3nc(C#N)c(C#N)nc3c2nc1C#N]

HATCN

TABLE 4-continued
Structural formulae of the materials for the OLEDs
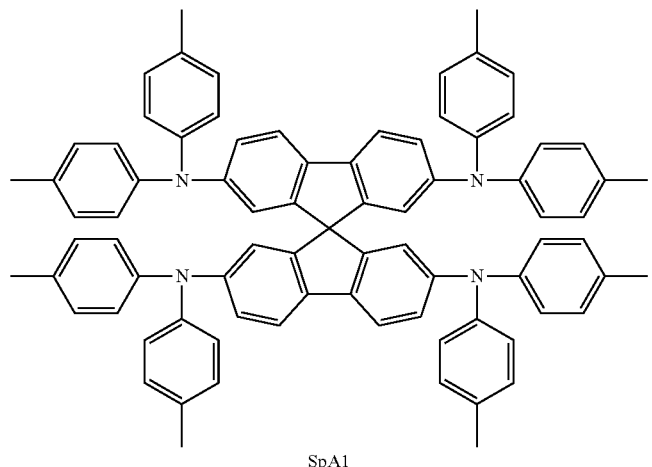
SpA1
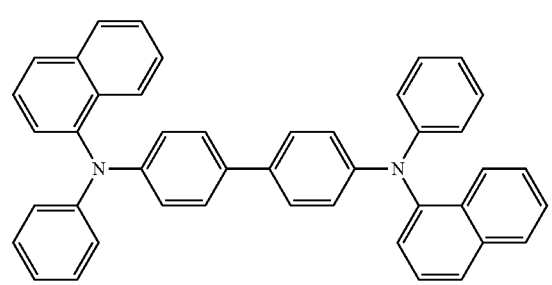 [SMILES: c1ccc(N(c2ccc(-c3ccc(N(c4ccccc4)c4cccc5ccccc45)cc3)cc2)c2cccc3ccccc23)cc1]
NPB
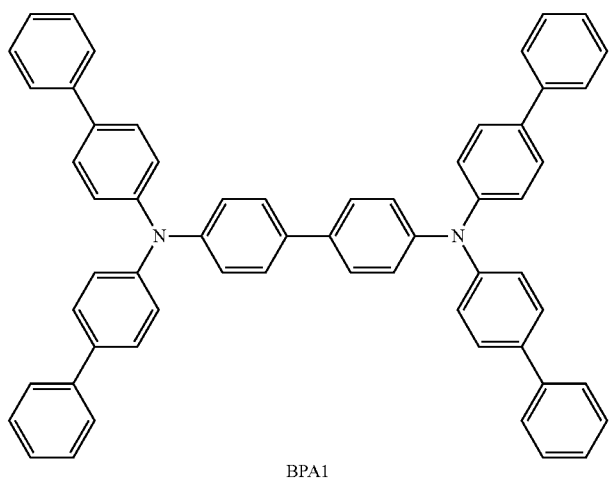
BPA1
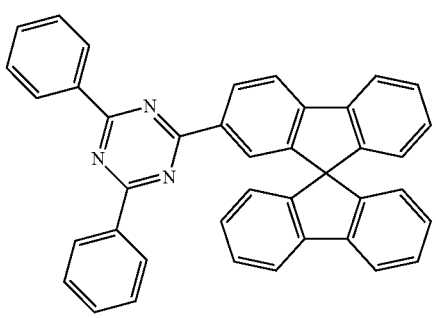 [SMILES: c1ccc(-c2nc(-c3ccccc3)nc(-c3ccc4c(c3)C3(c5ccccc5-c5ccccc53)c3ccccc3-4)n2)cc1]
ST1

TABLE 4-continued
Structural formulae of the materials for the OLEDs
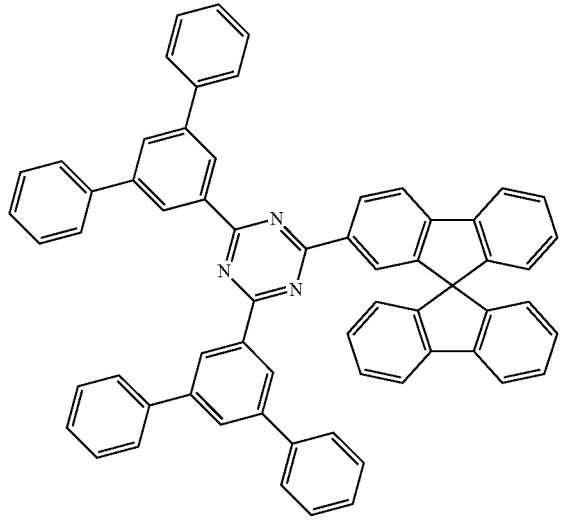 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ST2
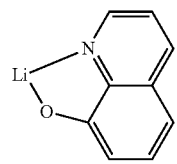
LiQ
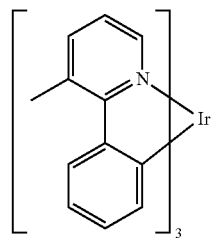
TEG1
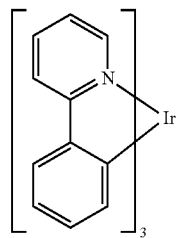
TEG2

TABLE 4-continued
Structural formulae of the materials for the OLEDs
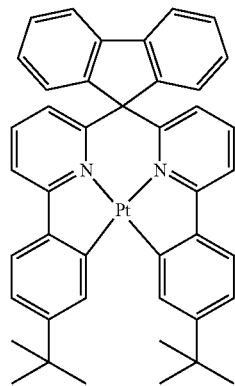
TEG3
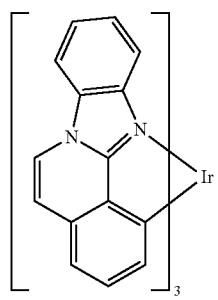
TEB1
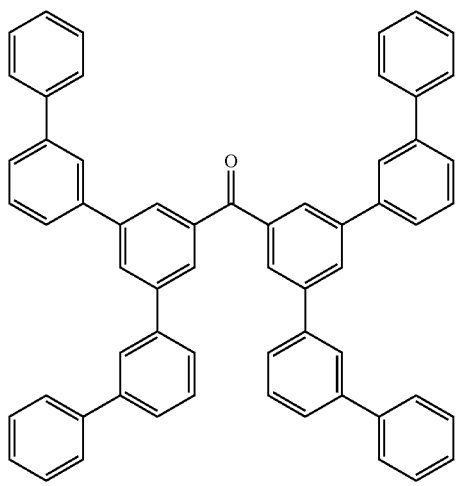 [SMILES: O=C(c1cc(-c2cccc(-c3ccccc3)c2)cc(-c2cccc(-c3ccccc3)c2)c1)c1cc(-c2cccc(-c3ccccc3)c2)cc(-c2cccc(-c3ccccc3)c2)c1]
Ket1

TABLE 4-continued
Structural formulae of the materials for the OLEDs
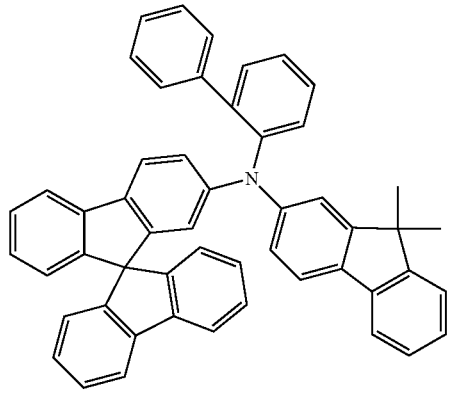 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
SPA2
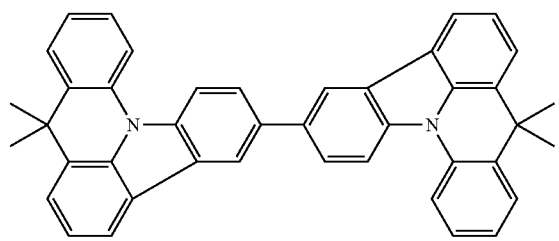
Cbz1
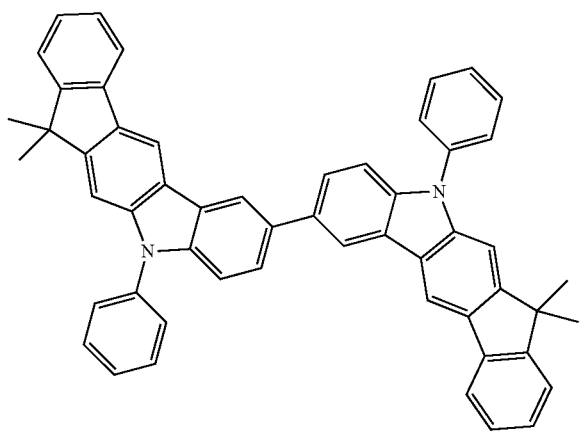
Cbz2

TABLE 4-continued
Structural formulae of the materials for the OLEDs
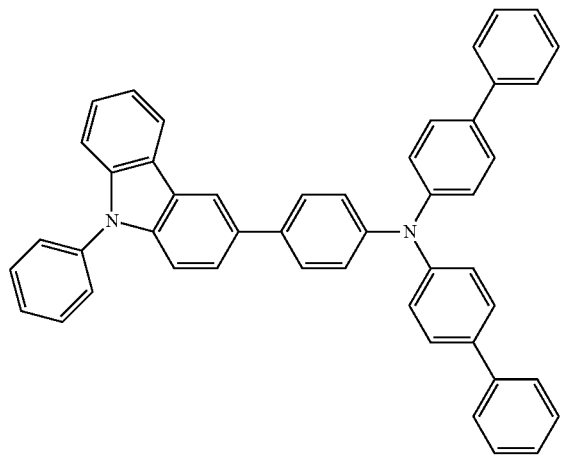 [SMILES: c1ccc(-c2ccc(N(c3ccc(-c4ccccc4)cc3)c3ccc(-c4ccc5c(c4)c4ccccc4n5-c4ccccc4)cc3)cc2)cc1]
CbzA1
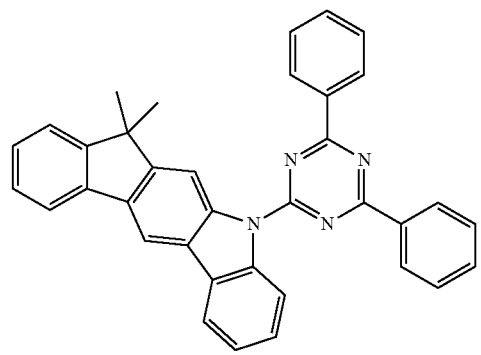 [SMILES: CC1(C)c2ccccc2-c2cc3c4ccccc4n(-c4nc(-c5ccccc5)nc(-c5ccccc5)n4)c3cc21]
IC1
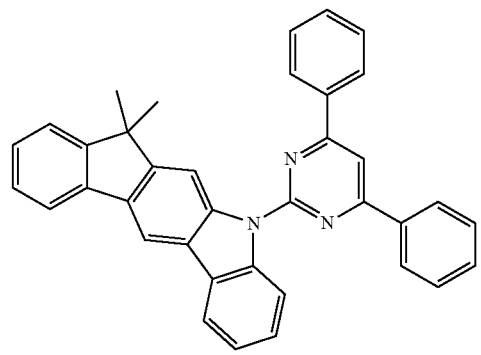 [SMILES: CC1(C)c2ccccc2-c2cc3c4ccccc4n(-c4nc(-c5ccccc5)cc(-c5ccccc5)n4)c3cc21]
IC2

TABLE 4-continued
Structural formulae of the materials for the OLEDs
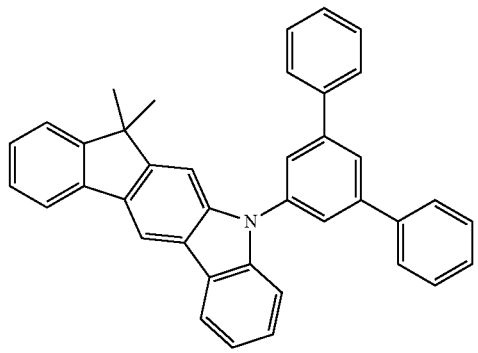 [SMILES: CC1(C)c2ccccc2-c2cc3c4ccccc4n(-c4cc(-c5ccccc5)cc(-c5ccccc5)c4)c3cc21]
IC3
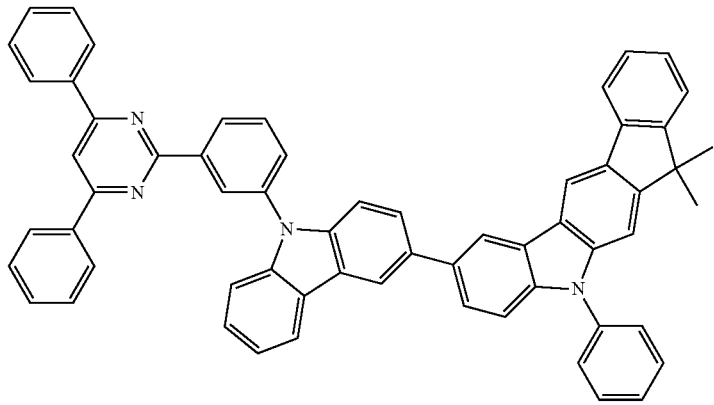 [SMILES: CC1(C)c2ccccc2-c2cc3c4cc(-c5ccc6c(c5)c5ccccc5n6-c5cccc(-c6nc(-c7ccccc7)cc(-c7ccccc7)n6)c5)ccc4n(-c4ccccc4)c3cc21]
IC4
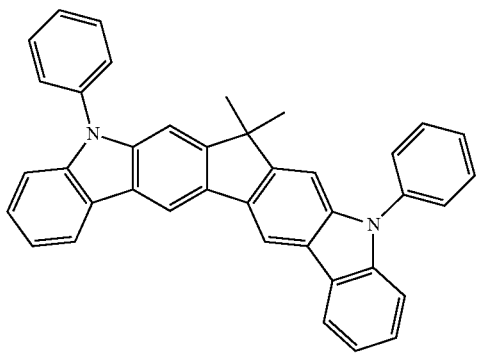 [SMILES: CC1(C)c2cc3c(cc2-c2cc4c5ccccc5n(-c5ccccc5)c4cc21)c1ccccc1n3-c1ccccc1]
IC5
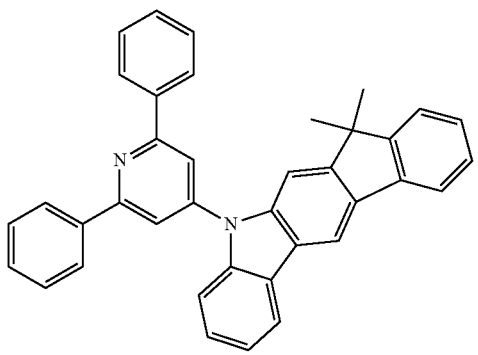 [SMILES: CC1(C)c2ccccc2-c2cc3c4ccccc4n(-c4cc(-c5ccccc5)nc(-c5ccccc5)c4)c3cc21]
IC6

TABLE 4-continued
Structural formulae of the materials for the OLEDs
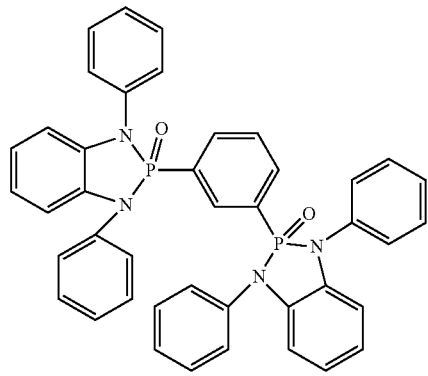 [SMILES: O=P1(c2cccc(P3(=O)N(c4ccccc4)c4ccccc4N3c3ccccc3)c2)N(c2ccccc2)c2ccccc2N1c1ccccc1]
DAP1
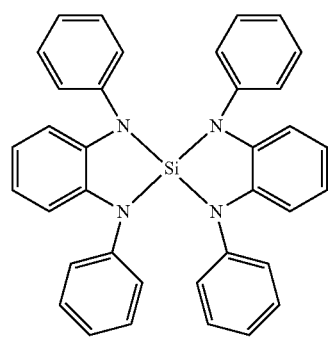 [SMILES: c1ccc(N2c3ccccc3N(c3ccccc3)[Si]23N(c2ccccc2)c2ccccc2N3c2ccccc2)cc1]
DAS1
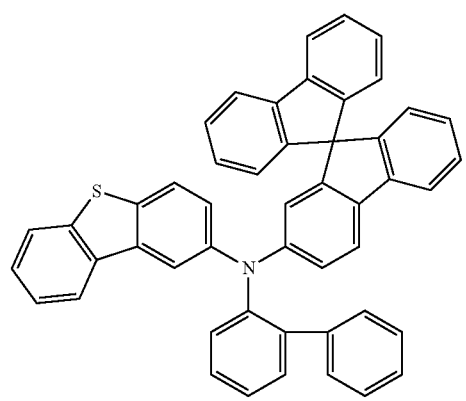 [SMILES: c1ccc(-c2ccccc2N(c2ccc3c(c2)C2(c4ccccc4-c4ccccc42)c2ccccc2-3)c2ccc3sc4ccccc4c3c2)cc1]
SPA3

TABLE 4-continued
Structural formulae of the materials for the OLEDs
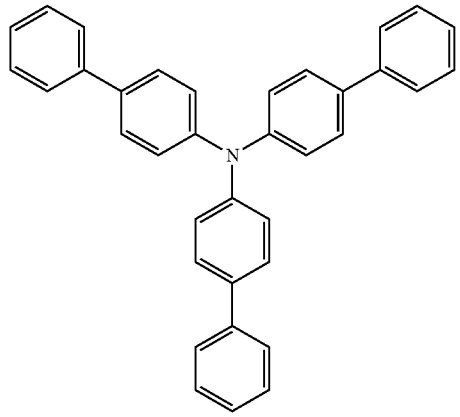 [SMILES: c1ccc(-c2ccc(N(c3ccc(-c4ccccc4)cc3)c3ccc(-c4ccccc4)cc3)cc2)cc1]
MA1
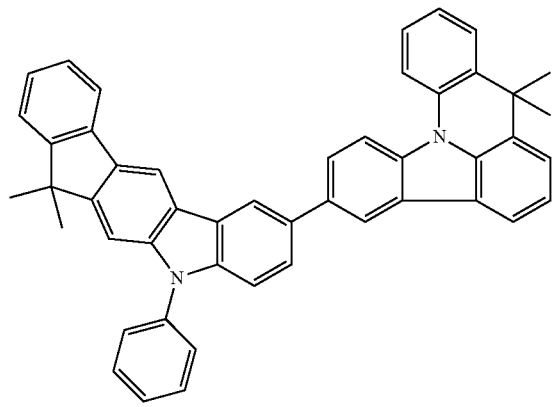
Cbz3
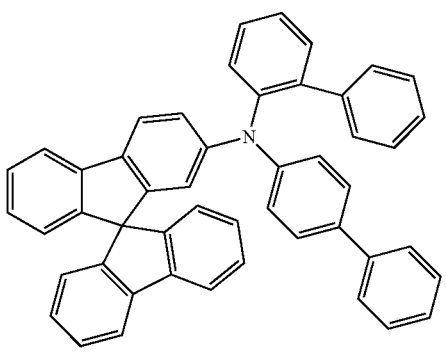 [SMILES: c1ccc(-c2ccc(N(c3ccc4c(c3)C3(c5ccccc5-c5ccccc53)c3ccccc3-4)c3ccccc3-c3ccccc3)cc2)cc1]
SPA4

TABLE 4-continued
Structural formulae of the materials for the OLEDs
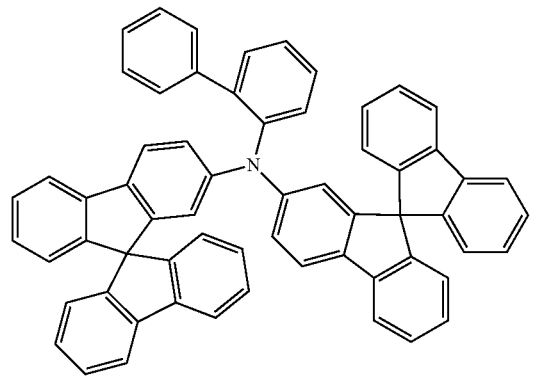 [SMILES: c1ccc(-c2ccccc2N(c2ccc3c(c2)C2(c4ccccc4-c4ccccc42)c2ccccc2-3)c2ccc3c(c2)C2(c4ccccc4-c4ccccc42)c2ccccc2-3)cc1]
SPA5
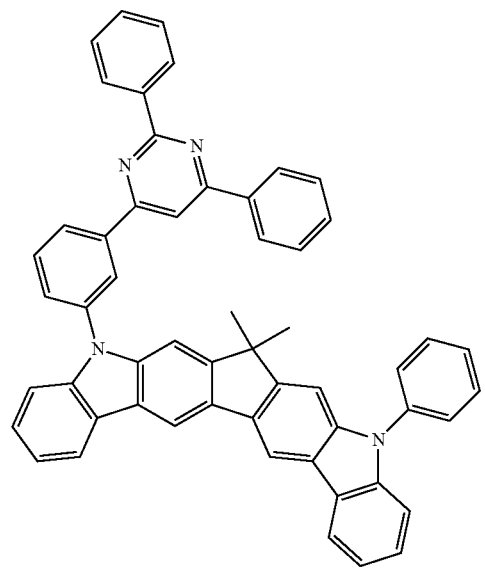 [SMILES: CC1(C)c2cc3c(cc2-c2cc4c5ccccc5n(-c5cccc(-c6cc(-c7ccccc7)nc(-c7ccccc7)n6)c5)c4cc21)c1ccccc1n3-c1ccccc1]
IC7
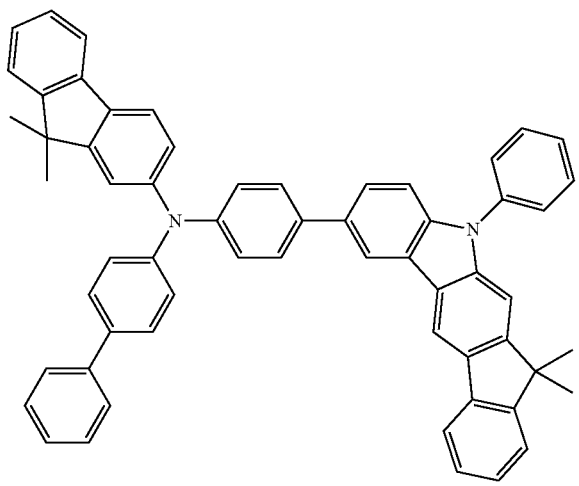 [SMILES: CC1(C)c2ccccc2-c2ccc(N(c3ccc(-c4ccccc4)cc3)c3ccc(-c4ccc5c(c4)c4cc6c(cc4n5-c4ccccc4)C(C)(C)c4ccccc4-6)cc3)cc21]
ICA1

TABLE 5

HOMO/LUMO values and triplet levels $T_1$ of the materials

| Material | HOMO (eV) | LUMO (eV) | $T_1$(eV) | Method |
|---|---|---|---|---|
| BPA1 | −5.14 | −2.27 | 2.52 | org. |
| NPB | −5.16 | −2.28 | 2.45 | org. |
| CbzA1 | −5.18 | −2.15 | 2.66 | org. |
| IC1 | −5.79 | −2.83 | 2.69 | org. |
| IC2 | −5.62 | −2.75 | 2.75 | org. |
| IC3 | −5.54 | −2.27 | 2.82 | org. |
| IC4 | −5.46 | −2.70 | 2.78 | org. |
| IC5 | −5.29 | −2.13 | 2.73 | org. |
| IC6 | −5.71 | −2.42 | 2.81 | org. |
| IC7 | −5.31 | −2.72 | 2.70 | org. |
| ST1 | −6.05 | −2.79 | 2.70 | org. |
| ST2 | −6.03 | −2.82 | 2.68 | org. |
| SPA2 | −5.25 | −2.18 | 2.58 | org. |
| SPA3 | −5.31 | −2.21 | 2.65 | org. |
| SPA4 | −5.31 | −2.16 | 2.64 | org. |
| SPA5 | −5.25 | −2.19 | 2.57 | org. |
| MA1 | −5.26 | −2.17 | 2.67 | org. |
| Cbz1 | −5.37 | −2.14 | 2.86 | org. |
| Cbz2 | −5.37 | −2.11 | 2.79 | org. |
| Cbz3 | −5.37 | −2.12 | 2.80 | org. |
| ICA1 | −5.12 | −2.21 | 2.51 | org. |
| DAP1 | −5.56 | −2.50 | 3.03 | org. |
| DAS1 | −5.43 | −1.81 | 3.25 | org. |
| Ket1 | −6.32 | −2.79 | 2.79 | org. |
| TEG1 | −5.21 | −2.26 | 2.68 | organom. |
| TEG2 | −5.30 | −2.35 | 2.71 | organom |
| TEG3 | −5.60 | −2.59 | 2.58 | organom |
| TEB1 | −5.23 | −2.14 | 2.89 | organom |
| LiQ | −5.17 | −2.39 | 2.13 | organom |

The invention claimed is:

1. Organic electroluminescent device having an emission maximum of ≤570 nm comprising, in this sequence, an anode, an electron-blocking layer (EBL), a phosphorescent emission layer (EML) which comprises at least one phosphorescent compound and at least one matrix material, where the total concentration of all phosphorescent compounds is <10% by vol., a hole-blocking layer (HBL) and a cathode, where the electroluminescent device comprises no aluminium metal complex between the emitting layer and the cathode, characterised in that the following applies to the layers:
   a) HOMO(EBL)−HOMO(EML)≤0.4 eV;
   b) LUMO(EML)−LUMO(HBL)≤0.4 eV;
   c) HOMO of all matrix materials of the EML≥−6.0 eV; and
   d) LUMO(EML)≤−2.5 eV;
where HOMO(EBL) represents the HOMO of the material of the electron-blocking layer, HOMO(EML) represents the HOMO of the matrix material of the emission layer, LUMO(EML) represents the LUMO of the matrix material of the emission layer and LUMO(HBL) represents the LUMO of the material of the hole-blocking layer;
wherein the HOMO and LUMO values are determined via quantum chemical calculations by performing energy calculations to arrive at values for HOMO HEh or LUMO LEh based on optimised geometry, and calibrating HOMO and LUMO values by the calculations below:

HOMO(eV)=((HEh*27.212)−0.9899)/1.1206

LUMO(eV)=((LEh*27.212)−2.0041)/1.385.

2. Organic electroluminescent device according to claim 1, characterised in that the total concentration of all phosphorescent compounds in the emitting layer is between 1 and 9% by vol.

3. Organic electroluminescent device according to claim 1, characterised in that the total concentration of all phosphorescent compounds in the emitting layer is between 2 and 8% by vol.

4. Organic electroluminescent device according to claim 1, characterised in that the following applies:
   a) HOMO(emitter)−HOMO(EML)≤0.3 eV; and
   b) LUMO(EML)−LUMO(emitter)≤0.3 eV,
   where HOMO(emitter) and LUMO(emitter) represent the HOMO and LUMO respectively of the phosphorescent emitter.

5. Organic electroluminescent device according to claim 1 having an emission maximum of ≤560 nm which comprises a total concentration of all phosphorescent compounds of between 1 and 9% by vol. in the emission layer and which comprises no aluminium metal complex between the emission layer and the cathode, characterised in that the following applies to the layers:
   a) HOMO(EBL)−HOMO(EML)≤0.35 eV;
   b) LUMO(EML)−LUMO(HBL)≤0.35 eV;
   c) HOMO of all matrix materials of the EML≥−5.9 eV; and
   d) LUMO(EML)≤−2.55 eV.

6. Organic electroluminescent device according to claim 1 having an emission maximum of ≤550 nm which comprises a total concentration of all phosphorescent compounds of between 2 and 8% by vol. in the emission layer and which comprises no aluminium metal complex between the emission layer and the cathode, characterised in that the following applies to the layers:
   a) HOMO(EBL)−HOMO(EML)≤0.3 eV;
   b) LUMO(EML)−LUMO(HBL)≤0.3 eV;
   c) HOMO of all matrix materials of the EML≥−5.8 eV; and
   d) LUMO(EML)≤−2.6 eV.

7. Organic electroluminescent device according to claim 1 having an emission maximum of ≤540 nm which comprises a total concentration of all phosphorescent compounds of between 3 and 7% by vol. in the emission layer and which comprises no aluminium metal complex between the emission layer and the cathode, characterised in that the following applies to the layers:
   a) HOMO(EBL)−HOMO(EML)≤0.25 eV;
   b) LUMO(EML)−LUMO(HBL)≤0.25 eV;
   c) HOMO of all matrix materials of the EML≥−5.8 eV; and
   d) LUMO(EML)≤−2.6 eV.

8. Organic electroluminescent device according to claim 1, characterised in that HOMO(EBL) is ≥−5.5 eV.

9. Organic electroluminescent device according to claim 1, characterised in that the following applies:
   $T_1$(emitter)−$T_1$(matrix)≤0.2 eV,
   where $T_1$(matrix) represents the triplet level of the matrix material and $T_1$(emitter) represents the triplet level of the phosphorescent emitter;
   wherein the triplet level $T_1$ is defined as the energy of the triplet state having the lowest energy resulting from the quantum chemical calculations.

10. Organic electroluminescent device according to claim 1, characterised in that the following applies:
   a) $T_1$(emitter)−$T_1$(EBL)≤0.3 eV and
   b) $T_1$(emitter)−$T_1$(HBL)≤0.3 eV,
   where $T_1$(EBL) represents the triplet level of the material of the electron-blocking layer and $T_1$(HBL) represents the triplet level of the material of the hole-blocking layer;
   wherein the triplet level $T_1$ is defined as the energy of the triplet state having the lowest energy resulting from the quantum chemical calculations.

11. Organic electroluminescent device according to claim 1, characterised in that, if two or more matrix materials are used, the concentration of the component having the highest HOMO is between 4 and 50% by vol.

12. Organic electroluminescent device according to claim 1, characterised in that the following applies: LUMO(EBL)−LUMO(EML)≥0.2 eV.

13. Organic electroluminescent device according to claim 1, characterised in that the following applies: HOMO(EML)−HOMO(HBL)≥0.2 eV.

14. Organic electroluminescent device according to claim 1, characterised in that, if two or more matrix materials are used, the component of the matrix material having the highest HOMO is selected from the group consisting of triarylamine derivatives, bridged triarylamine derivatives, carbazole derivatives, azacarbazole derivatives, condensed carbazole derivatives, diaza- and tetraazasilole derivatives and dibenzofuran and benzofuranyldibenzofuran derivatives.

15. Organic electroluminescent device according to claim 1, characterised in that, if two or more matrix materials are used, the component of the matrix material having the lowest LUMO is selected from the group consisting of aromatic ketones, aromatic phosphine oxides, aromatic sulfoxides or sulfones, silanes, azaboroles, boronic esters, triazine derivatives, pyrimidine derivatives, diazaphosphole derivatives, indolocarbazole derivatives which are substituted by electron-deficient heteroaromatic groups, or indenocarbazole derivatives which are substituted by electron-deficient heteroaromatic groups.

16. The device according to claim 1, wherein, to determine HOMO and LUMO values, for organic substances without metals, a geometry optimization is carried out using the "Groudn State/Semi-empirical/Default Spin/AM1/Charge 0/Spin Singlet" method, which is followed by an energy calculation on the basis of the optimised geometry; and, for organometallic compounds, the geometry is optimized via the "Ground State/Hartree-Fock/Default Spin/LanL2 MB/Charge 0/Spin Singlet" method, which is followed by an energy calculation on the basis of the optimised geometry.

* * * * *